US006936134B2

(12) United States Patent
Yonemizu et al.

(10) Patent No.: US 6,936,134 B2
(45) Date of Patent: Aug. 30, 2005

(54) SUBSTRATE PROCESSING APPARATUS AND SUBSTRATE PROCESSING METHOD

(75) Inventors: Akira Yonemizu, Kikuchi-Gun (JP); Shigeyoshi Kojima, Kikuchi-Gun (JP)

(73) Assignee: Tokyo Electron Limited, Tokyo-To (JP)

(*) Notice: Subject to any disclaimer, the term of this patent is extended or adjusted under 35 U.S.C. 154(b) by 0 days.

(21) Appl. No.: 09/986,894

(22) Filed: Nov. 13, 2001

(65) Prior Publication Data

US 2002/0056417 A1 May 16, 2002

(30) Foreign Application Priority Data

Nov. 14, 2000 (JP) ........................................ 2000-346602
Nov. 14, 2000 (JP) ........................................ 2000-346620

(51) Int. Cl.[7] .................... C23F 1/00; H01L 21/306; B65G 49/007; C23C 16/00
(52) U.S. Cl. ...................... 156/345.32; 156/345.27; 156/345.31; 156/345.52; 118/719; 414/939
(58) Field of Search ......................... 118/719, 725, 118/728, 724; 156/345.31, 345.27, 345.52

(56) References Cited

U.S. PATENT DOCUMENTS

| | | | | | |
|---|---|---|---|---|---|
| 4,389,296 A | * | 6/1983 | Seyffert et al. | ............. | 204/206 |
| 5,286,296 A | * | 2/1994 | Sato et al. | .................. | 118/719 |
| 5,303,671 A | * | 4/1994 | Kondo et al. | ................ | 118/719 |
| 5,433,785 A | * | 7/1995 | Saito | .......................... | 118/719 |
| 5,735,961 A | * | 4/1998 | Shimada | ..................... | 118/724 |
| 5,873,942 A | * | 2/1999 | Park et al. | ................... | 118/719 |
| 6,079,928 A | * | 6/2000 | Theriault et al. | ........... | 414/217 |
| 6,083,566 A | * | 7/2000 | Whitesell | ..................... | 427/445 |
| 6,183,564 B1 | * | 2/2001 | Reynolds et al. | ........... | 118/719 |
| 6,235,634 B1 | * | 5/2001 | White et al. | ................. | 438/680 |
| 6,287,984 B1 | * | 9/2001 | Horie | ......................... | 438/758 |
| 6,331,212 B1 | * | 12/2001 | Mezey, Sr. | .................. | 118/725 |
| 6,403,924 B1 | * | 6/2002 | Hayashi | ...................... | 219/390 |

FOREIGN PATENT DOCUMENTS

| | | | | |
|---|---|---|---|---|
| JP | 59-112870 | 6/1984 | | |
| JP | 07142408 A | * 6/1995 | ......... | H01L/21/205 |
| JP | 10-98037 | 4/1998 | | |
| JP | 2000-124206 | 4/2000 | | |
| JP | 2000-138213 | 5/2000 | | |

* cited by examiner

Primary Examiner—Parviz Hassanzadeh
Assistant Examiner—Karla Moore
(74) Attorney, Agent, or Firm—Oblon, Spivak, McClelland, Maier & Neustadt, P.C.

(57) ABSTRACT

A substrate processing apparatus comprises a heating process chamber in which a heating process is performed for a wafer, a load lock chamber, connected to the heating process chamber, for controlling at least oxygen concentration and pressure, a transferring arm transferring the wafer between the heating process chamber and the load lock chamber, and a gate valve shielding the heating process chamber from the load lock chamber. Thus, an insulation film with high quality can be formed. In addition, the wafer is temporarily placed in the load lock chamber adjacent to the heating process chamber without need to be transferred to another unit. Thus, the transferring time period for the wafer can be shortened. In addition, footprints can be decreased.

15 Claims, 18 Drawing Sheets

150°C
101300Pa
30sec

TEMPERATURE RAISED
PRESSURE REDUCED

450°C
100Pa
20min

PROCESS CONDITION 1

| TEMPERATURE(°C) | PRESSURE(Pa) | TIME PERIOD | PROCESS CHAMBER |
|---|---|---|---|
| 150 | 101300 | 30sec | HEATING PROCESS CHAMBER 151 |
| 23 | PRESSURE REDUCED | 10sec | LOAD LOCK CHAMBER 152 |
| 450 | 100 | 20min | HEATING PROCESS CHAMBER 151 |

FIG.9

PROCESS CONDITION 2

| TEMPERATURE(°C) | PRESSURE(Pa) | TIME PERIOD | PROCESS CHAMBER |
|---|---|---|---|
| 160 | 101300 | 20sec | HEATING PROCESS CHAMBER 151 |
| 23 | 101300 | 10sec | LOAD LOCK CHAMBER 152 |
| 450 | 101300 | 15min | HEATING PROCESS CHAMBER 151 |
| 23 | PRESSURE REDUCED | 10sec | LOAD LOCK CHAMBER 152 |
| 600 | 100 | 10sec | HEATING PROCESS CHAMBER 151 |

FIG.10

PROCESS CONDITION 3

| TEMPERATURE(°C) | PRESSURE(Pa) | TIME PERIOD | PROCESS CHAMBER |
|---|---|---|---|
| 180 | PRESSURE REDUCED | 20sec | LOAD LOCK CHAMBER 152 |
| 450 | 100 | 25min | HEATING PROCESS CHAMBER 151 |
| 23 | PRESSURE RAISED | 10sec | LOAD LOCK CHAMBER 152 |

FIG.11

PROCESS CONDITION 3

| TEMPERATURE(°C) | PRESSURE(Pa) | TIME PERIOD | PROCESS CHAMBER |
|---|---|---|---|
| 150 | PRESSURE REDUCED | 20sec | LOAD LOCK CHAMBER 152 |
| 450 | 133 | 25min | HEATING PROCESS CHAMBER 151 |
| 23 | PRESSURE RAISED | 20sec | LOAD LOCK CHAMBER 152 (OXYGEN SPRAYED) |

SUBSTRATE PROCESSING APPARATUS AND SUBSTRATE PROCESSING METHOD

BACKGROUND OF THE INVENTION

1. Field of the Invention

The present invention relates to a technical field of a semiconductor device production and so forth, in particular, to a substrate processing apparatus and a substrate processing method for performing a heating process for an insulation film material coated on a substrate.

2. Description of the Related Art

When a semiconductor device is produced, an inter-layer insulation film is formed by for example an SOD (Spin on Dielectric) system. The SOD system spin-coats a coating film on a wafer and performs for example a chemical process or a heating process for the coating film so as to form an inter-layer insulation film on the wafer.

When an inter-layer insulation film is formed by for example sol-gel method, an insulation film material is supplied on a semiconductor wafer (hereinafter referred to as "wafer"). The insulation film material is for example a solution of which a colloid of TEOS (tetraethoxysilane) has been dispersed to an organic solvent. Thereafter, a gelling process is performed for the wafer on which the solution has been supplied. Next, the solvent is substituted. A heating process is performed for the wafer of which the solvent has been substituted.

In the above-mentioned heating process, after the solvent is volatilized by for example a low temperature heating process, a high temperature heating process is performed so as to perform a polymerizing reaction for the wafer. In addition, recently, to accomplish a low dielectric constant insulation film (namely, as a means for causing an insulation film to be porous), a high temperature heating process is performed for a short time period as a post treatment process.

At present, since the low temperature heating process, the high temperature heating process, and the post treatment process are performed by different units, footprints increase and throughput decreases because wafers should be transferred among those units.

To solve such a problem, it may be thought that those heating processes are performed by one unit. However, in that case, a waiting time is required until the temperature condition of the heating process chamber is changed for the next step. In the waiting time, the film quality may deteriorate.

In addition to the process temperatures, the atmosphere and pressure slightly vary in each process. Thus, when the atmosphere and pressure condition are changed, they may adversely affect the film quality.

SUMMARY OF THE INVENTION

The present invention is made from the above-described point of view. An object of the present invention is to provide a substrate processing apparatus that allows the film quality to be properly maintained while sufficiently decreasing footprints and shortening the transferring time.

In addition, nowadays, to accomplish a high speed device and a low power consumption, as a condition of quality of an insulation film, a low dielectric constant insulation film is required. To accomplish a low dielectric constant insulation film, a porous film may be used. However, since a porous film is weak, a desired hardness cannot be obtained. Thus, the use of a porous material is restricted.

Therefore, another object of the present invention is to provide a substrate processing method and a substrate processing apparatus that allow an insulation film having a predetermined dielectric constant and a desired hardness to be formed.

To accomplish the above-described object, a first aspect of the present invention is a substrate processing apparatus, comprising a heating process chamber in which a heating process is performed for a substrate, a load lock chamber, connected to the heating process chamber, for controlling at least oxygen concentration and pressure, a transferring arm for transferring the substrate between the heating process chamber and the load lock chamber, and a gate valve for shielding the heating process chamber from the load lock chamber.

In such a structure, after a predetermined heating process has been performed in the heating process chamber, a substrate is temporarily placed in the load lock chamber whose oxygen concentration and pressure are the same as those of the heating process chamber. Thus, the film can be stably formed and thereby the film quality can be properly maintained.

When a condition of the heating process is changed and the heating process is performed with the changed condition, a substrate is temporarily placed in the load lock chamber disposed adjacent to the heating process chamber without need to convey the substrate to another unit. Thus, the transferring time can be shortened. In addition, footprints can be decreased.

The substrate processing apparatus of the first aspect of the present invention further comprises a first exhausting portion vacuum exhausting the heating process chamber, a second exhausting portion normally exhausting the heating process chamber, and a selector adaptively selecting the first exhausting portion or the second exhausting portion and causing the selected means to operate. The first exhausting portion reduces the inner pressure of the heating process chamber to around 1330 Pa or less. The second exhausting portion reduces the inner pressure of the heating process chamber to around 100000 Pa or less. Thus, the internal pressure of the heating process chamber can be controlled corresponding to each processing condition.

The substrate processing apparatus of the first aspect of the present invention further comprises a controller controlling the temperature of the heating process for the substrate in the heating process chamber. The controller is capable of controlling the temperature in the range from 100° C. to 800° C. Thus, the heating process can be performed corresponding to a variety of types of insulation films.

The substrate processing apparatus of the first aspect of the present invention further comprises a supplier supplying inert gas to the heating process chamber. Thus, the oxygen concentration in the heating process chamber can be dynamically controlled. Consequently, the heating process can be performed corresponding to a verity of types of insulation films.

In the substrate processing apparatus of the first aspect of the present invention, the transferring arm has a temperature adjusting portion adjusting the temperature of the substrate placed on the transferring arm. Thus, since the low temperature heating process as the pre-stage of the heating process performed in the heating process chamber is performed in the load lock chamber, the process time can be shortened.

In the substrate processing apparatus of the first aspect of the present invention, the load lock chamber has an opening through which the substrate is transferred to/from the outside, and a shutter for allowing the opening to be opened and closed. Thus, the load lock chamber can be air-tightly shielded so that the substrate is not exposed to the outer air.

In the substrate processing apparatus of the first aspect of the present invention, when the heating process for the substrate is performed in the heating process chamber in a changed processing condition, the substrate is temporarily placed on the transferring arm in the load lock chamber. Thus, the heating process can be performed in a plurality of processing conditions whose temperatures are different so that the substrate is not exposed to the outer air. Thus, the substrate can be prevented from being oxidized. In addition, the throughput can be improved.

The substrate processing apparatus of a first aspect of the present invention further comprises a supplier supplying active gas to the load lock chamber, and a sprayer spraying the active gas to a front surface of the substrate in the load lock chamber so as to reform the front surface of the substrate. Thus, only the front surface of the insulation film is oxidized. As a result, the front surface of the insulation film can be more hardened. After the temperature adjusting process and the surface oxidizing process are performed in the load lock chamber, the substrate is unloaded to the outside and directly exposed to the outer air. However, since the temperature adjusting process has been performed, the temperature of the substrate has been lowered. In addition, since the front surface of the insulation film has been oxidized, the front surface is not further oxidized. Thus, an insulation film in high quality can be formed.

A second aspect of the present invention is a substrate processing apparatus, comprising a heating process chamber in which a heating process is performed for a substrate, a load lock chamber, connected to the heating process chamber, controlling at least oxygen concentration and pressure, a transferring arm for transferring the substrate between the heating process chamber and the load lock chamber and performing a heating process for the substrate, and a gate valve for shielding the heating process chamber from the load lock chamber.

In such a structure, when a condition of the heating process is changed and the heating process is performed with the changed condition, a substrate is temporarily placed in the load lock chamber disposed adjacent to the heating process chamber without need to convey the substrate to another unit. Thus, the film quality can be properly maintained. The transferring time can be shortened. In addition, footprints can be decreased.

In the substrate processing apparatus of the second aspect of the present invention, the temperature of the heating process in the heating process chamber is in the range for 400° C. to 450° C., whereas the temperature of the heating process in the transferring arm is in the range from 15° C. to 250° C.

A third aspect of the present invention is a substrate processing apparatus, comprising a heating process chamber in which a heating process is performed for a substrate, a first exhausting portion for vacuum exhausting the heating process chamber, a second exhausting portion normally exhausting the heating process chamber, and a selector adaptively selecting the first exhausting portion or the second exhausting portion and causing the selected means to operate.

In such a structure, since the normal exhaust whose pressure is nearly the same as the atmosphere as the first exhaust or the vacuum exhaust using vacuum as the second exhaust can be selected, by controlling the pressure and oxygen concentration in the heating process chamber along with an air flow therein, the film quality can be improved.

A fourth aspect of the present invention is a substrate processing apparatus, comprising a process chamber, a heating plate, disposed in the process chamber, performing a heating process for the substrate, a supplier supplying inert gas, reactive gas, or liquid vaporous substance to the process chamber, and a pressure reducing portion reducing the inner pressure of the process chamber.

The substrate processing apparatus of the fourth aspect of the present invention further comprises a controller controlling the supplier and the pressure reducing portion so that the oxygen concentration of the process chamber decreases at a velocity in the range from around 6000 ppm/second to 20000 ppm/second. Thus, an insulation film with a desired hardness and a desired relative dielectric constant can be formed.

A fifth aspect of the present invention is a substrate processing method, comprising the steps of (a) raising the temperature of a substrate to a predetermined temperature at which a heating process is performed for the substrate and decreasing the oxygen concentration in an area of which the substrate is processed at a velocity in the range from around 6000 ppm/second to 20000 ppm/second, and (b) performing the heating process for the substrate at the predetermined temperature in the area with the decreased oxygen concentration.

In such a structure, an insulation film with a desired hardness and a desired relative dielectric constant can be formed. In the substrate processing method of the fifth aspect of the present invention, the step (a) is performed by decreasing the oxygen concentration of the area in which the heating process is performed for the substrate at a velocity of around 10000 ppm/second.

In the substrate processing method of the fifth aspect of the present invention, step (a) is performed by reducing the inner pressure of the area while inert gas, reactive gas, or liquid vaporous gas is being supplied to the area so as to decrease the oxygen concentration of the area.

In the substrate processing method of the fifth aspect of the present invention, the step (a) includes the step of increasing the oxygen concentration of the area. Thus, only the front surface of the insulation film can be oxidized. Consequently, an insulation film with a desired hardness can be obtained.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 9 is a table showing a processing condition according to the embodiment of the present invention;

FIG. 10 is a table showing a processing condition according to the embodiment of the present invention;

FIG. 11 is a table showing a processing condition according to the embodiment of the present invention;

DETAILED DESCRIPTION OF PREFERRED EMBODIMENTS

Next, with reference to the accompanying drawings, embodiments of the present invention will be described.

Figure 1:
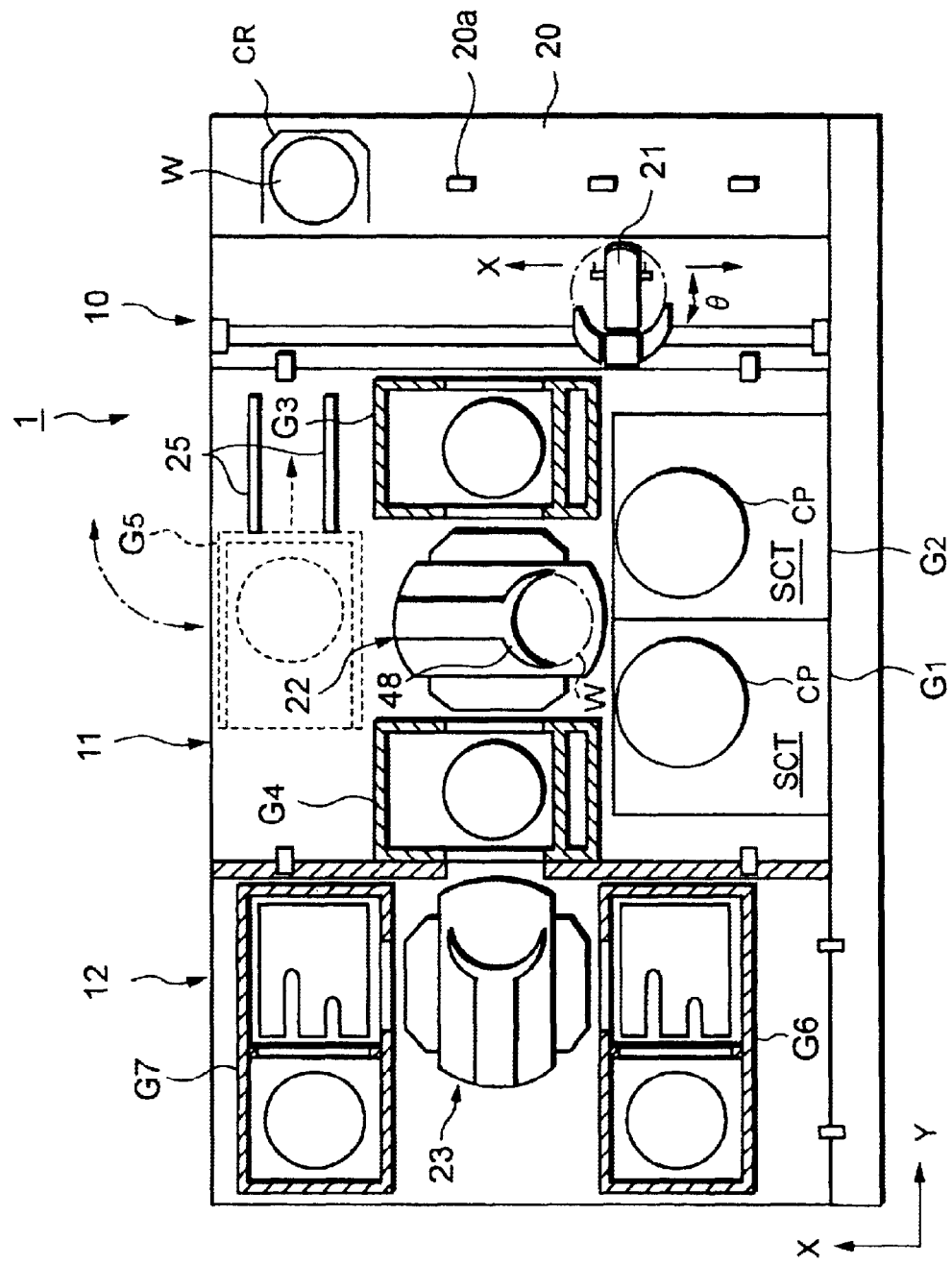
FIG. 1 is a plan view showing the overall structure of an SOD system according to the present invention.
Figure 2:
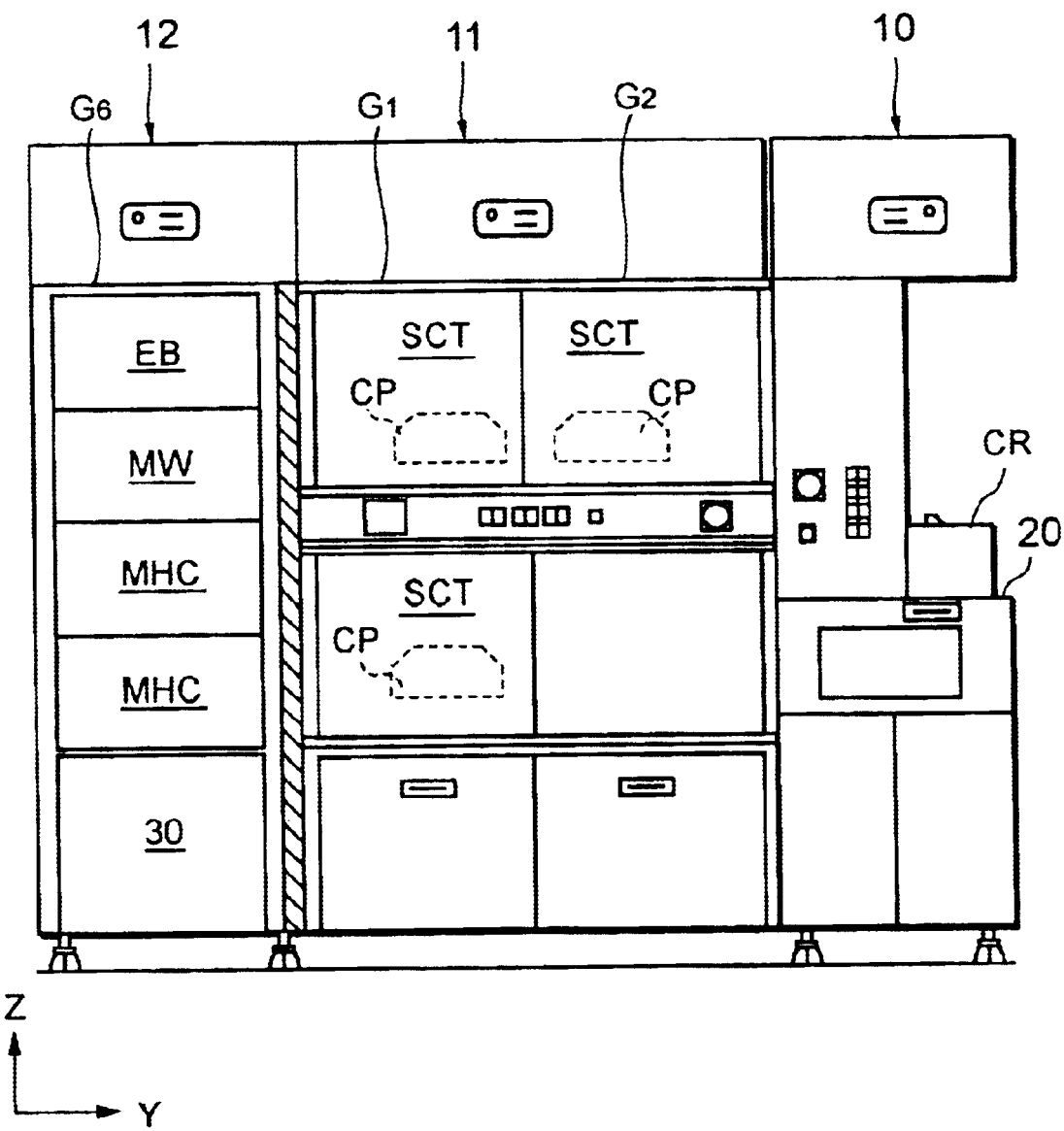
FIG. 2 is a front view showing the SOD system shown in FIG. 1.
Figure 3:
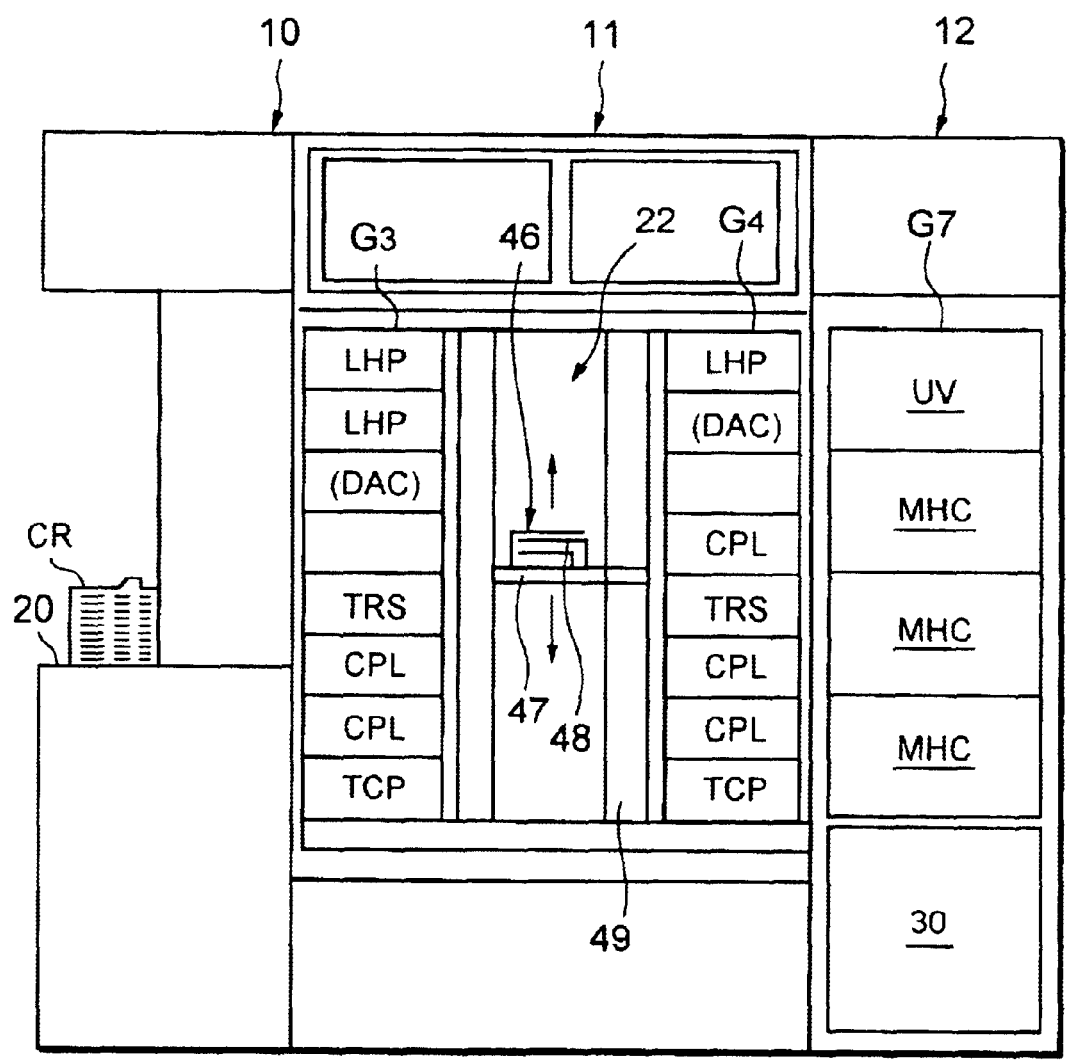
FIG. 3 is a rear view showing the SOD system shown in FIG. 1.

FIGS. 1 to 3 show the overall structure of an SOD system according to an embodiment of the present invention. FIG. 1 is a plan view, FIG. 2 is a front view, and a rear view of the SOD system.

Referring to FIGS. 1 to 3, an SOD system 1 is composed of a cassette block 10, a first processing block 11, and a second processing block 12 that are integrally connected. The cassette block 10 transfers a cassette CR from the outside of the SOD system 1 to the inside thereof or vice versa and loads and unloads a semiconductor wafer W (hereinafter referred as a wafer W) to/from a cassette CR. One cassette CR contains a plurality of wafers W, for example, 25 wafers W. The first processing block 11 is composed of a variety of single wafer process units that are disposed at predetermined positions and that perform predetermined SOD coating processes. The second processing block 12 is composed of a variety of single wafer process units that are disposed at predetermined positions and whose heating process units deal with higher temperature processes than heating process units of the first processing block 11.

As shown in FIG. 1, in the cassette block 10, a plurality of wafer cassettes CR, for example, up to four wafer cassettes CR, are aligned in the X direction at protruded positions on a cassette table 20 in such a manner that wafer loading/unloading openings of the cassettes CR face the first processing block 11. A wafer transfer mechanism 21 selectively accesses each wafer of each wafer cassette CR in the cassette arrangement direction (X direction) and the wafer arrangement direction (Z direction, vertical direction). In addition, the wafer transfer mechanism 21 can be rotated in the θ direction. As will be described later, the wafer transfer mechanism 21 can also access a transferring and cooling plate (TCP) of a multi-staged process unit portions of a third group G3 of the first processing block 11.

As shown in FIG. 1, the first processing block 11 has a first main transfer mechanism 22 of vertical transferring type at a center portion. At least one group of process units is disposed as multi-staged processing units around the first main transfer mechanism 22. In the example shown in FIGS. 1 to 3, the first processing block 11 is composed of five groups of multi-staged processing units. The five groups are G1, G2, G3, G4, and G5. The first and second groups G1 and G2 as multi-staged processing units are disposed on the front side (near side in FIG. 1) of the system. The third group G3 as multi-staged processing units is disposed adjacent to the cassette block 10. The fourth group G4 as multi-staged processing units is disposed adjacent to the second processing block 12.

As shown in FIG. 2, in the first group G1, two SOD coating process units (SCT) are disposed multi-staged from the bottom. In each SOD coating process unit (SCT), a wafer W is placed on a spin chuck in a cup CP. An insulation film material is supplied. By rotating the wafer W, a coating film is equally coated thereon.

In the second group G2, an SOD coating process unit (SCT) is disposed on an upper stage. When necessary, an SOD coating process unit (SCT), a solvent exchanging process unit (DSE), and so forth may be disposed on lower stages of the second group G2.

As shown in FIG. 3, in the third group G3, a transferring and cooling plate (TCP), two cooling process units (CPL), a transition unit (TRS), and two low temperature heating process units (LHP) are disposed multi-staged from the bottom. When necessary, an aging process unit (DAC) may be disposed on a lower stage of the low temperature heating process unit (LHP). The aging process unit (DAC) has an air-tight process chamber. In the air-tight process chamber, with NH3+H2O supplied therein, an aging process is performed for a wafer W so as to cause the insulation film material to wet gel.

In the fourth group G4, a transferring and cooling plate (TCP), three cooling process units (CPL), a transition unit (TRS), and a low temperature heating process unit (LHP) are disposed on multi-staged from the bottom. When necessary, the aging process unit (DAC) may be disposed on a lower stage of the low temperature heating process unit (LHP).

The transferring and cooling plate (TCP) is composed of two stages, having a cooling plate that cools a wafer W at the bottom and a transferring table on the top. The transferring and cooling plate (TCP) transfers a wafer W between the cassette block 10 and the first processing block 11. Likewise, the transition unit (TRS) transfers a wafer W between the cassette block 10 and the first processing block 11. The cooling process unit (CPL) has a cooling plate on which a wafer W is placed. The cooling process unit (CPL) performs a cooling process for a wafer W.

Moreover, in the SOD system 1, as was described above, the fifth group G5 as multi-staged processing units is disposed on the rear side of the first main transfer mechanism as depicted by a broken line. The fifth group G5 as multi-staged processing units can be shifted sideward along a guide rail 25 viewed from the first main transfer mechanism 22. Thus, even if the fifth group G5 as multi-staged processing units is disposed as shown in FIG. 1, since it is slid along the guide rail 25, a maintenance space can be kept. Thus, a maintenance work can be easily performed on the rear of the first main transfer mechanism 22. Alternatively, even if the fifth group G5 as multi-staged processing units is rotated outside the system as depicted by a two-way dot-dash arrow mark rather than linearly slid along the guide rail 25, a maintenance space can be kept for the first main transfer mechanism 22.

As was described above, in the second processing block 12, a sixth group G6 having high temperature heating process units is disposed on the front side of the system. Likewise, a seventh group G7 having high temperature heating process units is disposed on the rear side of the system. Between the sixth group G6 and the seventh group G7, a second main transfer mechanism 23 is disposed. The second main transfer mechanism 23 accesses the fourth group G4, the sixth group G6, and the seventh group G7 and transfers a wafer W thereto. As with the first main transfer mechanism 22, the second main transfer mechanism 23 is of vertical transferring type.

The SOD system 1 is disposed in for example a clean room. The atmosphere of the first main transfer mechanism 22 is controlled so that the pressure therein is higher than the atmospheric pressure of the clean room. Thus, particles that take place in the first main transfer mechanism 22 are exhausted from the SOD system 1. On the other hand, the higher pressure prevents particles in the clean room from entering the SOD system 1.

As shown in FIGS. 2 and 3, the sixth group G6 is composed of two multi-functional hot plate curing units (MHC), which are process units according to the present invention, a micro wave process unit (MW), and an electron beam process unit (EB) arranged on respective stages upward in succession. The micro wave process unit (MW) and the electron beam process unit (EB) radiate a microwave and an electron beam to a film so as to heat and reform the film, respectively. On the other hand, the seventh group G7 is composed of three multi-functional hot plate curing units (MHC), which are units according to the present invention, and an ultraviolet ray process unit (UV) arranged on respective stages upward in succession. The ultraviolet ray process unit (UV) radiates an ultraviolet ray to a film so as to heat and reform it.

Figure 4:
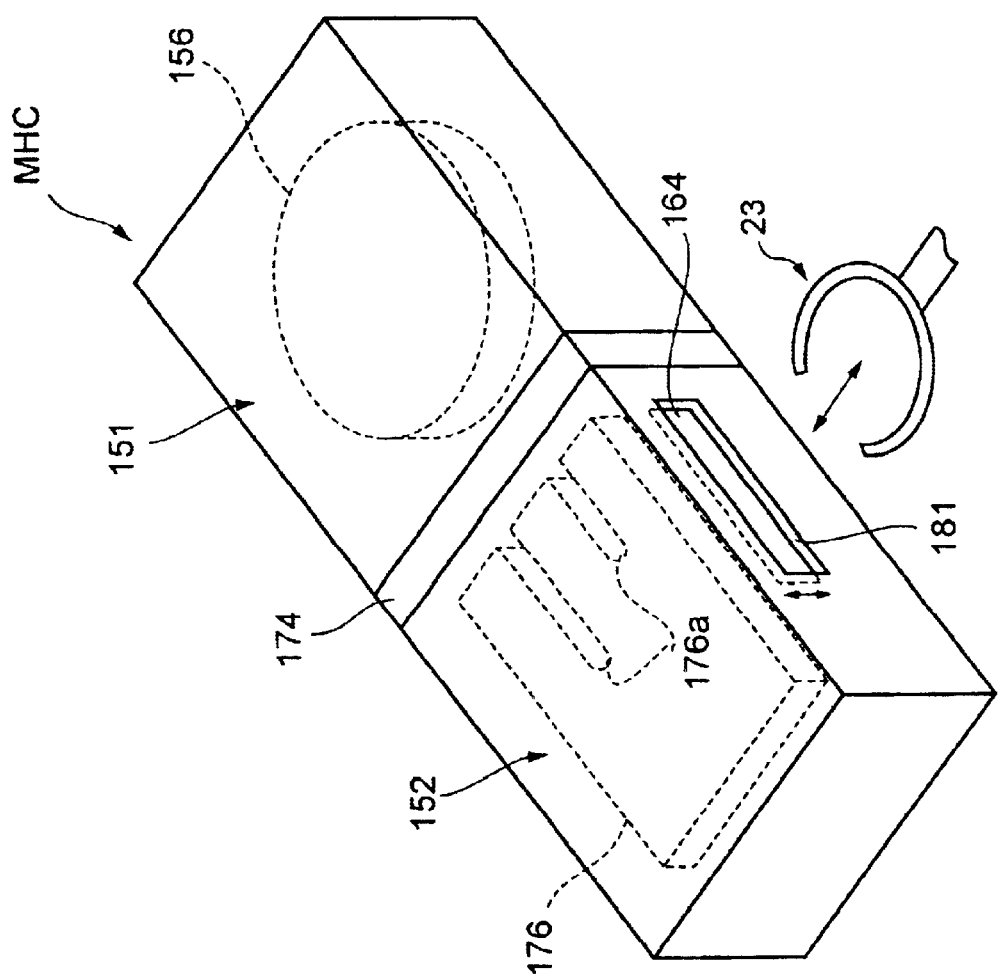
FIG. 4 is a perspective view showing a multi-functional hot plate curing unit (MHC) according to the present invention.
Figure 5:
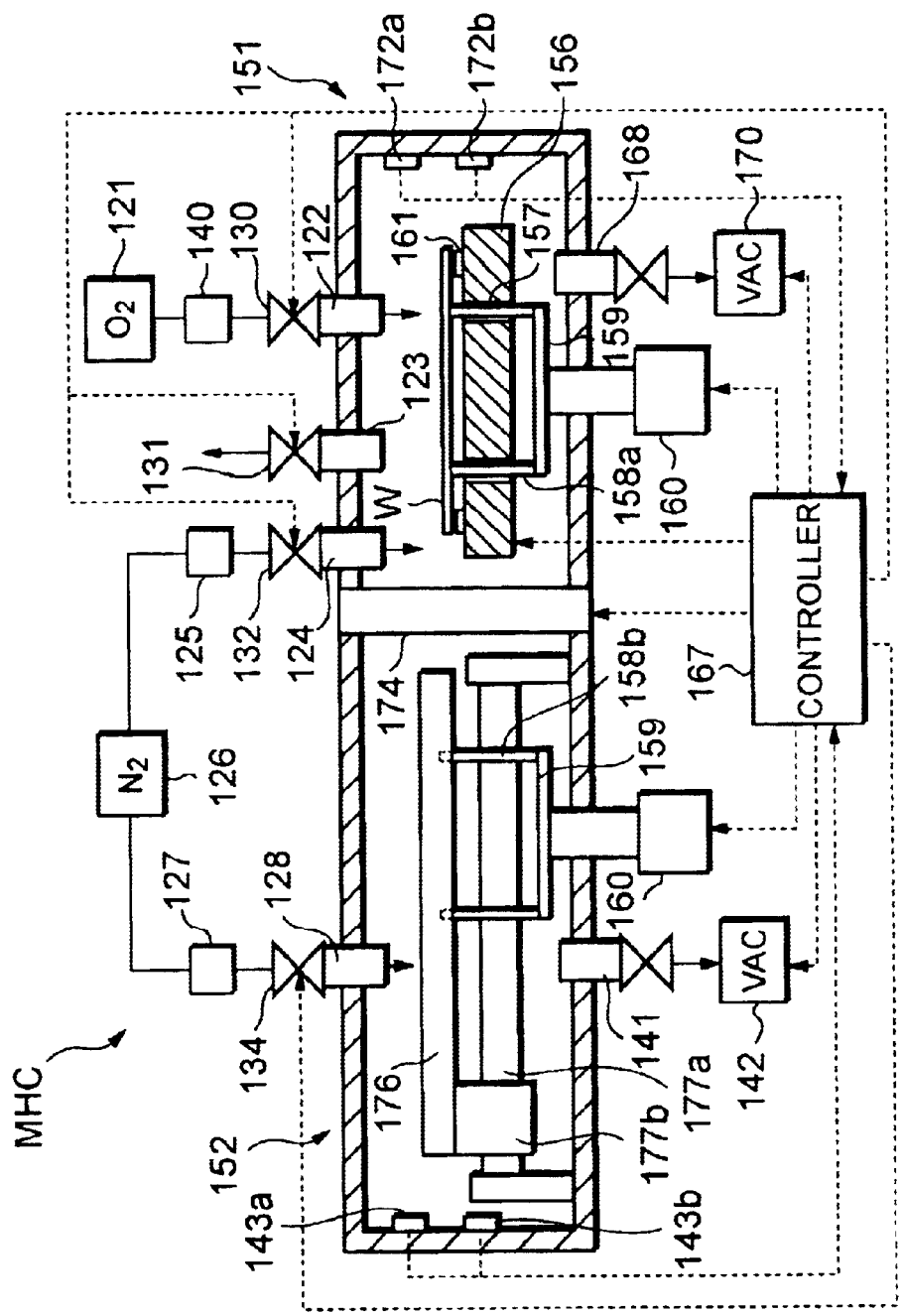
FIG. 5 is a sectional view showing the multi-functional hot plate curing unit (MHC) shown in FIG. 4.

FIGS. 4 and 5 are a perspective view and a sectional view showing the above-mentioned multi-functional hot plate curing unit (MHC).

The multi-functional hot plate curing unit (MHC) has a heating process chamber 151 and a load lock chamber 152. The load lock chamber 152 is disposed adjacent to the heating process chamber 151. The heating process chamber 151 is air-tightly structured with a closable gate valve 174 so as to transfer a wafer W with the load lock chamber 152.

A heating plate 156 is disposed at a nearly center portion of the heating process chamber 151. The heating plate 156 is used to perform a heating process for a wafer W. In the heating plate 156, for example a heater (not shown) is buried. The heating temperature can be set in the range from for example 100° C. to 800° C. In the heating plate 156, a plurality of, for example, three holes 157 are vertically formed in concentric circle shapes. Support pins 158a that support a wafer W are inserted into the holes 157 so that the support pins 158a are raised and lowered. On the rear surface of the heating plate 156, the support pins 158a are integrally connected to a connecting member 159. The connecting member 159 is raised and lowered by a raising/lowering cylinder 160 disposed below the connecting member 159. As the raising/lowering cylinder 160 is raised and lowered, the support pins 158a protrude and sink from/in the front surface of the heating plate 156.

In addition, a plurality of proximity pins 161 are disposed on the front surface of the heating plate 156. The proximity pins 161 prevent a wafer W for which a heating process is performed from contacting the heating plate 156. Thus, when the heating process is performed, the wafer W is prevented from being charged with static electricity.

In addition, a nitrogen supplying opening 124 and an oxygen supplying opening 122 are formed at an upper portion of the heating process chamber 151. Through the nitrogen supplying opening 124, inert gas, for example, nitrogen is supplied to the heating process chamber 151. Through the oxygen supplying opening 122, oxygen is supplied to the heating process chamber 151. The nitrogen supplying opening 124 is connected to a nitrogen gas supply source 126 through a valve 132. The valve 132 controls open/close states of the supply of nitrogen gas. Likewise, the oxygen supplying opening 122 is connected to an oxygen supply source 121 through a valve 130. The valve 130 controls open/close states of the supply of oxygen. In addition, a first nitrogen temperature controller 125 is disposed between the nitrogen gas supply source 126 and the valve 132. The first nitrogen temperature controller 125 adjusts the temperature of nitrogen gas supplied from the nitrogen gas supply source 126 to the chamber. Likewise, an oxygen temperature controller 140 is disposed between the oxygen supply source 121 and the valve 130. The oxygen temperature controller 140 adjusts the temperature of oxygen supplied from the oxygen supply source 121 to the chamber. With the first nitrogen temperature controller 125 and the oxygen temperature controller 140 that control the gas temperatures, a film can be formed in an optimum state without adversely affecting the heating process temperature. In addition, an exhaust opening 123 is formed at an upper portion of the heating process chamber 151. Through the exhaust opening 123, gas is exhausted from the heating process chamber 151. The exhaust opening 123 is connected to an ejector (not shown) through a valve 131. The ejector reduces the pressure to around 100000 Pa that is slightly lower than the atmospheric pressure. The valve 131 controls open/close states of the ejector. (Hereinafter, the gas exhaust of the ejector is referred to as normal exhaust.) The open/close states of the valves 130, 131, and 132 are controlled corresponding to the measured results of a gas sensor 172a and a pressure sensor 172b. The gas sensor 172a measures the oxygen concentration in the heating process chamber 151. The pressure sensor 172b measures the pressure in the heating process chamber 151.

In addition, a pressure reducing exhaust opening 168 is disposed at a lower portion of the heating process chamber 151. The exhaust opening 168 is connected to for example a vacuum pump 170. With the operation of the vacuum pump 170, the inner pressure of the heating process chamber 151 can be set to a pressure lower than the atmospheric pressure, for example, 1330 Pa or lower, more preferably around 13 Pa. (Hereinafter, the pressure reduction by the vacuum pump 170 is referred to as vacuum exhaust). The operation of the vacuum pump 170 is controlled by a controller 167 corresponding to the measured result of the pressure sensor 172b.

An opening 181 (see FIG. 4) is disposed in the load lock chamber 152. Through the opening 181, a wafer W is transferred from and to the second main transfer mechanism 23. The opening 181 is opened and closed with a shutter 164. With the shutter 164 and the above-described gate valve 174, the load lock chamber 152 is air-tightly closed.

A nitrogen supply opening 128 is formed at an upper portion of the load lock chamber 152. Through the nitrogen supply opening 128, nitrogen is supplied. The nitrogen supply opening 128 is connected to the nitrogen gas supply source 126 through a valve 134. The valve 134 controls open/close states of the supply of nitrogen gas. In addition, a second nitrogen temperature controller 127 is disposed between the nitrogen gas supply source 126 and the valve 134. The second nitrogen temperature controller 127 adjusts the temperature of nitrogen gas supplied from the nitrogen gas supply source 126 to the chamber. In the chamber, a gas sensor 143a and a pressure sensor 143b are disposed. The open/close states of the valve 134 and the operation of a vacuum pump 142 are controlled corresponding to the measured results of the gas sensor 143a and the pressure sensor 143b. The gas sensor 143a measures the concentration of oxygen in the chamber. The pressure sensor 143b measures the pressure in the chamber. An exhaust opening 141 is disposed at an inner lower portion of the load lock chamber 152. Through the exhaust opening 141, the inner pressure of the chamber is reduced. The exhaust opening 141 is connected to for example the vacuum pump 142. With the operation of the vacuum pump 142 under the control of the controller 167, the inner pressure of the load lock chamber 152 is reduced.

A transferring arm 176 is disposed in the load lock chamber 152. The transferring arm 176 has a temperature adjusting portion that adjusts the temperature of a wafer W. The transferring arm 176 is horizontally movable by a moving mechanism 177b along a guide member 177a. The temperature of the transferring arm 176 can be set in the range from 15 to 25° C. The transferring arm 176 can enter into the heating process chamber 151 through the gate valve 174. The transferring arm 176 receives a wafer W that has been heated by the heating plate 156 of the heating process chamber 151 through the support pins 158a and then loads the wafer W to the load lock chamber 152 so as to adjust the temperature of the wafer W. As the temperature adjusting mechanism, for example cooling water or a Peltier element is used.

Below the transferring arm 176, support pins 158b are disposed in the heating process chamber 151. As with the support pins 158a, the support pins 158b protrude and sink. The support pins 158b are integrally connected to a supporting member 159 on the rear surface of the transferring arm 176. The supporting member 159 is raised and lowered by a raising/lowering cylinder 160 disposed below the supporting member 159. The support pins 158a, for example, three pins can protrude and sink from/in cut-out portions 176a of the transferring arm 176 as shown in FIG. 4.

Figure 6:
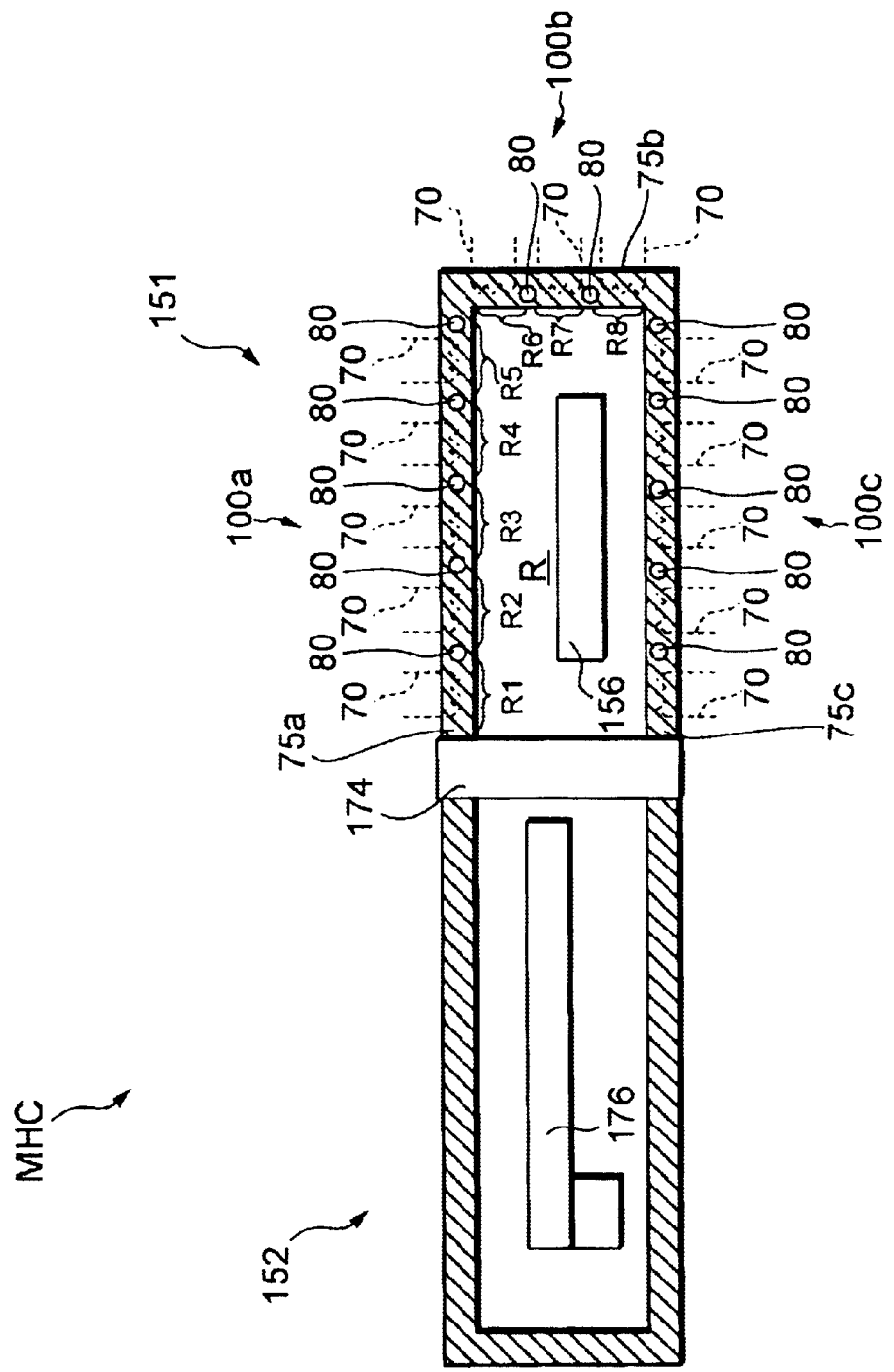
FIG. 6 is a schematic diagram showing a temperature adjusting mechanism of a wall portion of the multi-functional hot plate curing unit (MHC) shown in FIG. 4.

Referring to FIG. 6, an upper wall portion 75a, a side wall portion 75b, and a lower wall portion 75c are formed so that they surround an area R including the heating plate 156. In the wall portions 75a, 75b, and 75c, temperature adjusting mechanisms 100a, 100b, and 100c are disposed, respectively. The temperature adjusting mechanism 100a, 100b, and 100c adjust the temperature of the area R. Each of the temperature adjusting mechanisms 100a to 100c is composed of a heater 70 and a cooling pipe 80 buried in the respective walls. The controller 167 (see FIG. 5) controls the power supplied to the heaters 70 and the temperature and amount of cooling water supplied to the cooling pipes 80. With the temperature adjusting mechanisms 100a to 100c, the inner temperature of the process chamber can be more accurately controlled. Alternatively, as shown in FIG. 6, the upper wall portion 75a of the heating process chamber 151 may be divided into five areas R1 to R5. Each area may be controlled by the temperature adjusting mechanism 100. Likewise, the lower wall portion 75c may be divided into five areas. Each area may be controlled by the temperature adjusting mechanism 100c. Moreover, the side wall portion 75b may be divided into three areas R6 to R8. Each area may be independently controlled by the temperature adjusting mechanism 100b. As a result, while the inner temperature of the heating process chamber 151 is accurately controlled, an air flow therein can be controlled. For example, when a higher temperature is set to the upper area than the lower area, an upward air flow deliberately takes place. Thus, sublimates and so forth that take place from a wafer W can be securely exhausted to the outside (for example, through an exhaust opening) without adversely affecting the wafer W.

As shown in FIGS. 2 and 3, the vacuum pump 170, the gas supply sources 121 and 126, and so forth are disposed in a chemical chamber 30 disposed below the multi-functional hot plate curing unit (MHC).

Figure 7:
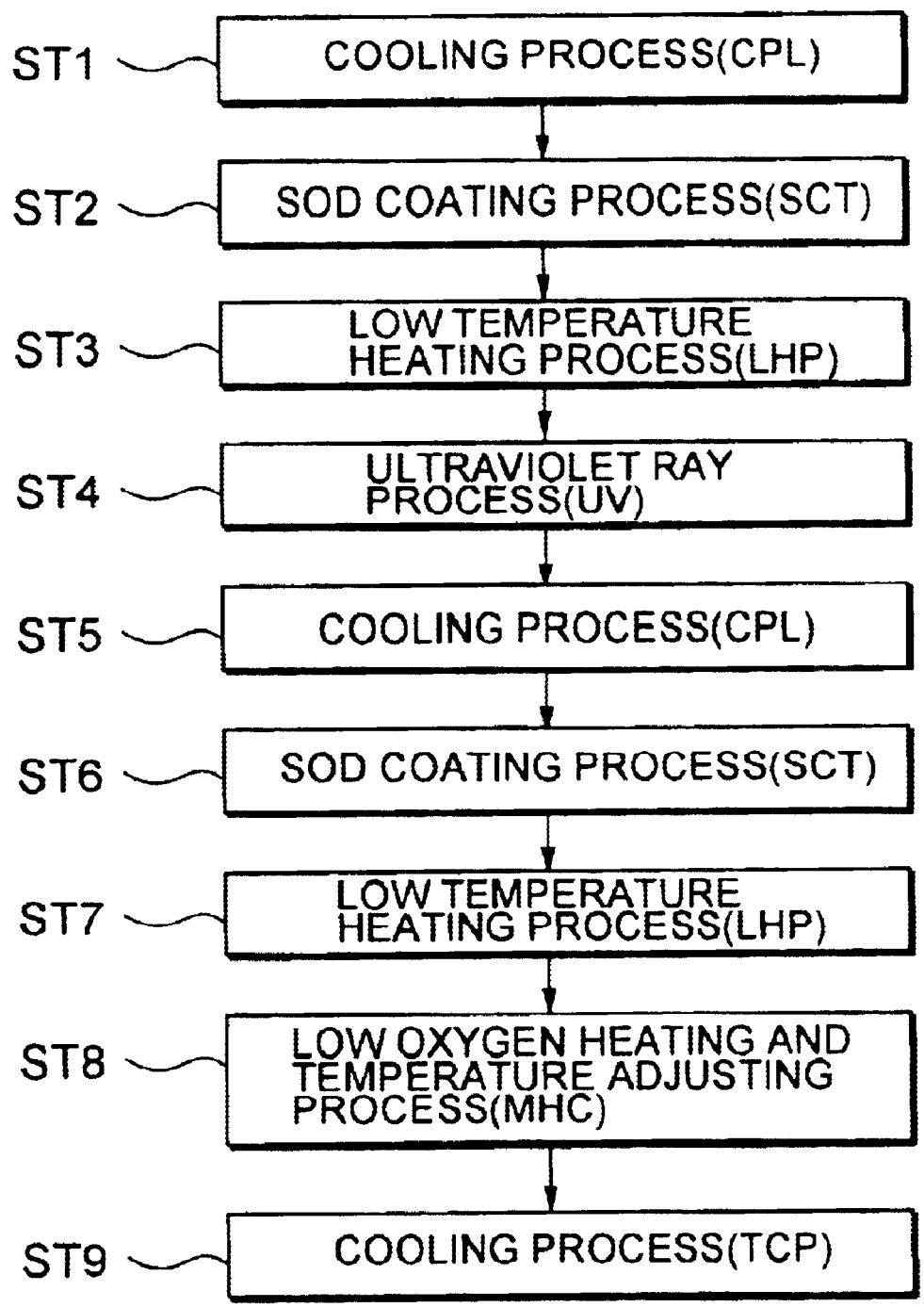
FIG. 7 is a flow chart showing steps of a process of the SOD system according to an embodiment of the present invention.

Next, with reference to a flow chart shown in FIG. 7, processing steps of the SOD system 1 will be described.

First of all, in the cassette block 10, a wafer W that has not been processed is transferred from a wafer cassette CR to the transfer table or the transition unit (TRS) of the transferring and cooling plate (TCP) of the third group G3 on the first processing block 11 side through the wafer transfer mechanism 21.

The wafer W transferred to the transfer table of the transferring and cooling plate (TCP) is transferred to the cooling process unit (CPL) through the first main transfer mechanism 22. In the cooling process unit (CPL), the wafer W is cooled to a temperature suitable for the process of the SOD coating process unit (SCT) (step 1). The wafer W for which the cooling process has been performed by the cooling process unit (CPL) is transferred to the SOD coating process unit (SCT) through the first main transfer mechanism 22. In the SOD coating process unit (SCT), the SOD coating process is performed for the wafer W (step 2).

The wafer W for which the SOD coating process has been performed by the SOD coating process unit (SCT) is transferred to the low temperature heating process unit (LHP) through the first main transfer mechanism 22. In the low temperature heating process unit (LHP), the low temperature heating process is performed for the wafer W (step 3).

After the low temperature heating process has been performed for the wafer W by the low temperature heating process unit (LHP), the wafer W is transferred to the ultraviolet ray process unit (UV) through the transfer table of the transferring and cooling plate (TCP) or the transition unit (TRS) of the fourth group G4 through the second main transfer mechanism 23. In the ultraviolet ray process unit (UV), the wafer W is processed with an ultraviolet ray with a wavelength of 172 nm (step 4). In the process using the ultraviolet ray, the ultraviolet ray process unit (UV) is filled with nitrogen gas sprayed as an atmospheric gas. In the state, an ultraviolet ray is radiated from an ultraviolet ray radiating lamp for a time period of for example one minute.

Instead of the ultraviolet ray process or after the ultraviolet ray process has been performed, an electron beam process or a micro wave process may be performed by the electron beam process unit (EB) or the micro wave process unit (MW) of the sixth group G6.

After the ultraviolet ray process has been performed for the wafer W, it is transferred to the cooling process unit (CPL) of the fourth group G4 through the second main transfer mechanism 23. In the cooling process unit (CPL), the wafer W is cooled (step 5).

After the cooling process has been performed for the wafer W by the cooling process unit (CPL), the wafer W is transferred to the SOD coating process unit (SCT) through the first main transfer mechanism 22 once again. In the SOD coating process unit (SCT), the SOD coating process is performed for the wafer W once again as a second process (step 6). At that point, since the ultraviolet ray process has reformed the insulation film material coated on the wafer W so that the front surface of the insulation film material has a low contact angle, even if insulation film material is further coated on the wafer W, the surface does not become rough.

After the SOD coating process has been performed for the wafer W by the SOD coating process unit (SCT), the wafer W is transferred to the low temperature heating process unit (LHP) through the first main transfer mechanism 22. In the low temperature heating process unit (LHP), the low temperature heating process is performed for the wafer W (step 7).

After the low temperature heating process has been performed for the wafer W by the low temperature heating process unit (LHP), the wafer W is transferred to the multi-functional hot plate curing unit (MHC) through the second main transfer mechanism 23. In the multi-functional hot plate curing unit (MHC), the heating process and the temperature adjusting process are performed at the predetermined oxygen concentration and pressure (step 8).

Thereafter, the wafer W is transferred to the cooling plate of the transferring and cooling plate (TCP). On the cooling plate of the transferring and cooling plate (TCP), the cooling process is performed for the wafer W (step 9).

After the cooling process has been performed for the wafer W by the transferring and cooling plate (TCP), the wafer W is transferred to the wafer cassette CR through the wafer transfer mechanism 21 in the cassette block 10.

Next, with reference to FIGS. 4 and 5, the heating operation of the multi-functional hot plate curing unit (MHC) will be described.

First of all, the shutter 164 is opened. Thereafter, the second main transfer mechanism 23 that holds a wafer W enters into the load lock chamber 152 through the opening 181. The wafer W is placed on the transferring arm 176 through the support pins 158b. Thereafter, the shutter 164 is closed. Thus, the load lock chamber 152 is air-tightly closed. Thereafter, while the inner pressure of the load lock chamber 152 is reduced by the vacuum pump 142, the valve 134 is opened and nitrogen is supplied to the load lock chamber 152 so that the inner pressure thereof becomes the same as the atmospheric pressure. At that point, the oxygen concentration is decreased until it becomes around 20 ppm. Thus, the wafer W can be prevented from being oxidized. If nitrogen is purged, while the inner pressure is reduced, the throughput can be improved. At that point, the inner pressure of the heating process chamber 151 is reduced (vacuum exhausted) and nitrogen is purged therefrom so that the inner pressure and oxygen concentration of the heating process chamber 151 become the same as those of the load lock chamber 152.

Thereafter, the gate valve 174 is opened. While the temperature of the wafer W is being adjusted, the wafer W is transferred to the heating process chamber 151. The wafer W is placed on the support pins 158a that have protruded from the front surface of the heating plate 156. In such a manner, while the temperature of the wafer W that has not been heated is being adjusted, the wafer W is transferred. Thus, the heat history of the wafer W can be equal.

After the wafer W has been transferred to the heating plate, the transferring arm 176 is returned to the original position. Thereafter, the gate valve 174 is closed. As a result, an air-tightly closed space is formed in the heating process chamber 151. Thereafter, the heating process is started by the heating plate 156. FIG. 9 shows the relation among heating process temperature, pressure, and heating process time period (as processing condition 1) according to the embodiment.

(Processing Condition 1)

Figure 8A:
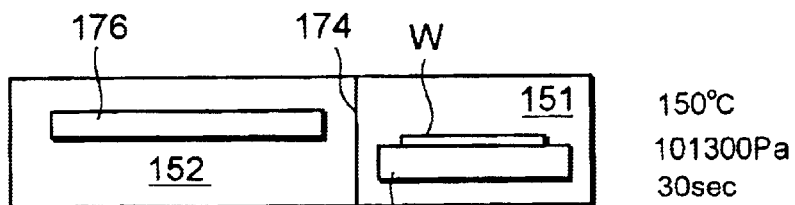
FIGS. 8A to 8E are schematic diagrams showing a wafer traveled between process chambers in one processing condition.
Figure 8B:
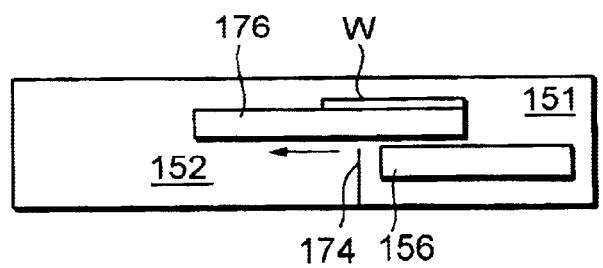
Figure 8C:
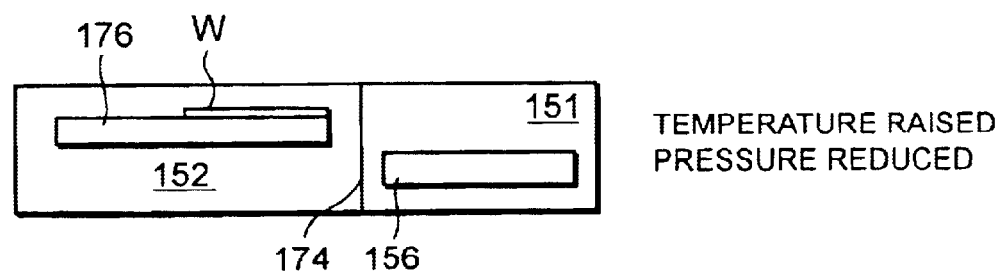
Figure 8D:
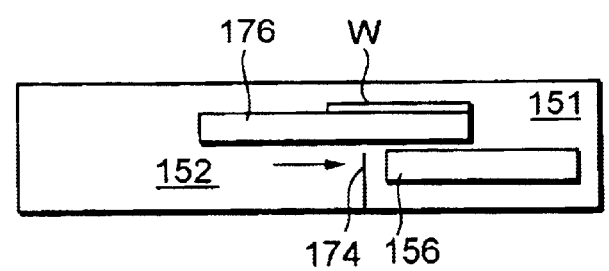
Figure 8E:
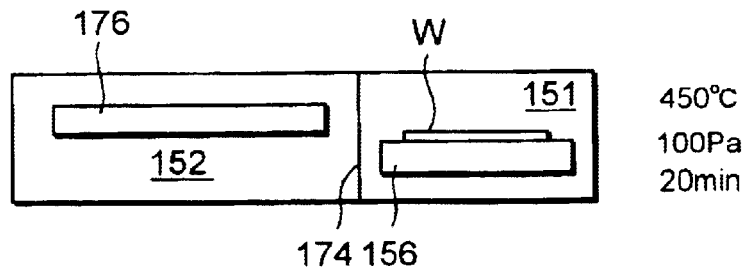

According to the embodiment, referring to FIGS. 8A to 8E, the heating process is performed at a temperature of 150° C. at an atmospheric pressure of 101300 Pa for a time period of for example 30 seconds (see FIG. 8A). As a result, solvent contained in the insulation film is volatilized. Thereafter, the gate valve 174 is opened. As shown in FIG. 8B, the wafer W is transferred from the heating plate 156 to the transferring arm 176. While the temperature adjusting process is being performed for the wafer W at a temperature of for example 23° C., the wafer W is loaded to the load lock chamber 152 (see FIG. 8C). Thereafter, the heating process chamber 151 is vacuum exhausted until the inner pressure thereof becomes for example 100 Pa. Thereafter, the temperature of the heating plate 156 is raised. At that point, the inner pressure of the load lock chamber 152 is reduced so that the inner pressure of the load lock chamber 152 becomes the same as the inner pressure of the heating process chamber 151. Thereafter, the gate valve 174 is opened (see FIG. 8D). The wafer W is transferred from the transferring arm 176 to the heating plate 156 once again. On the heating plate 156, the heating process is performed for the wafer W at a predetermined temperature of 450° C. at a pressure of 100 Pa for a time period of for example 20 minutes (see FIG. 8E). As a result, an insulation film is formed on the wafer W by a polymerizing reaction.

In such a manner, after the predetermined heating process has been performed for a wafer W by the heating process chamber 151, when a processing condition of the heating process chamber 151 is changed, the wafer W is temporarily placed in the load lock chamber 152 whose inner pressure and atmosphere are the same as those of the heating process chamber 151, an insulation film can be stably formed and the film quality can be properly maintained.

In the heating process of the heating process chamber 151, while the normal exhaust is performed, oxygen may be supplied to the chamber so that the oxygen concentration may be varied at a constant inner pressure. Thus, the front surface of the insulation film can be more hardened. Alternatively, when the inner pressure, the oxygen concentration, the air flow, and so forth of the chamber are controlled with only the normal exhaust, a variety of types of low dielectric constant films and high dielectric constant films can be formed with high quality.

(Processing Condition 2)

As shown in FIG. 10, a wafer W is transferred by the second main transfer mechanism 23 to the load lock chamber 152 through the opening 181. Thereafter, the load lock chamber 152 and the heating process chamber 151 are air-tightly closed. The inner pressures of the load lock chamber 152 and the heating process chamber 151 are reduced (vacuum exhausted) and nitrogen is supplied thereto in such a manner that the oxygen atmosphere and pressure (atmospheric pressure) of the load lock chamber 152 become the same as those of the heating process chamber 151. The wafer W is transferred to the heating process chamber 151 through the gate valve. In the heating process chamber 151, the heating process is performed for the wafer W at a heating temperature of 160° C. at an atmospheric pressure for a time period of 20 seconds. As a result, solvent contained in the insulation film is volatilized. In the load lock chamber 152 that is air-tightly closed, the temperature adjusting process is performed for the wafer W under an atmospheric pressure for a time period of 10 seconds at a temperature of 23° C. In this state, the temperature of the heating plate of the heating process chamber 151 is raised. In the heating process chamber 151 that is air-tightly closed, the heating process is performed for the wafer W under an atmospheric pressure for a time period of 15 minutes at a temperature of 450° C. so that a polymerizing reaction is performed for the wafer W. In the load lock chamber 152 that is air-tightly closed, the inner pressure is reduced (vacuum exhausted). In the state, the temperature adjusting process is performed for the wafer W at a temperature of 23° C. for a time period of 10 seconds. In addition, the atmospheres of the heating process chamber 151 and the load lock chamber 152 are set so that the atmospheres thereof becomes the same. The wafer W is transferred to the heating process chamber 151 once again (for the third time). In the heating process chamber 151, the heating process is performed for the wafer W at a pressure of 100 Pa, at a heat process temperature of 600° C. for a time period of 10 seconds. As a result, a porous film is formed on the wafer W (as a post treatment process). In the post treatment process, an insulation film with a low dielectric constant (for example, a relative dielectric constant in the range from 1.5 to 3.5) can be formed.

(Processing Condition 3)

FIG. 11 shows processing condition 3 according to the embodiment of the present invention. In the processing condition 3, in addition to a water cooling mechanism of the transferring arm 176, for example a heater is built in the transferring arm 176. A wafer W can be heated at a predetermined temperature in the range from 15° C. to 250° C.

In the processing condition 3, a wafer W is transferred by the second main transfer mechanism 23 to the load lock chamber 152 through the opening 181. The load lock chamber 152 is air-tightly closed. While the inner pressure of the load lock chamber 152 is being reduced, the wafer W placed on the transferring arm 176 is heated at a temperature of for example 180° C. for a time period of 20 seconds. As a result, solvent contained in the insulation film is volatilized. Thereafter, the wafer W is transferred to the heating process chamber 151 whose inner pressure and atmosphere are the same as those of the load lock chamber 152. In the heating process chamber 151, the heating process is performed for the wafer W at a temperature of for example 450° C. for a time period of for example 25 minutes. Thereafter, the inner pressures of the heating process chamber 151 and the load lock chamber 152 are raised. The wafer W is removed from the heating process chamber 151 by the transferring arm 176. Thereafter, the temperature adjusting process is performed for the wafer W at a temperature of 23° C.

Figure 12:
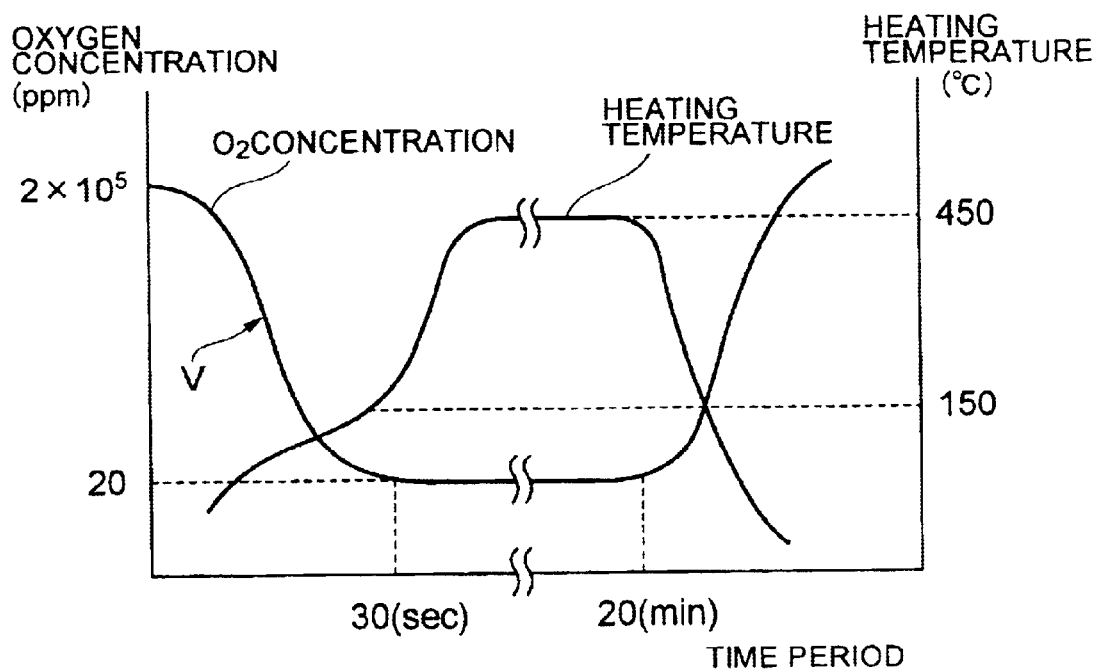
FIG. 12 is a graph showing the relation among process time, heating temperature, and oxygen concentration in the heating process chamber in the processing condition shown in FIG. 9.

FIG. 12 shows the relation among heating time period, heating temperature, and oxygen concentration in the processing condition 1 performed in the heating process chamber 151. As shown in FIG. 12, after the heating process is started (nitrogen gas is supplied), an oxygen concentration of around 200000 ppm is decreased to 20 ppm in a time period of for example 10 to 30 seconds. In other words, the inner pressure of the heating process chamber 151 is reduced at a velocity V in the range from around 6000 ppm/second to 20000 ppm/second. The pressure reduction is performed by the vacuum exhaust or both the vacuum exhaust and the normal exhaust while nitrogen is supplied so that an atmospheric pressure of 101300 (Pa) is maintained (see FIG. 9). More preferably, after the heating process is started, the inner pressure is reduced for a time period of around 20 seconds (namely, at a velocity of around 10000 ppm/second). Since the atmosphere of the chamber is purged with nitrogen while the inner pressure of the chamber is being reduced, the oxygen concentration can be more quickly decreased. After the heating process had been started, when 30 seconds elapsed, the heating temperature becomes in the range from around 100° C. to 200° C. According to the embodiment, the heating temperature is for example 150° C.

After the heating process had been started, when 30 seconds elapsed, the supply amount of oxygen gas or HMDS is controlled so that the oxygen concentration becomes 20 ppm. In the state, the heating process is performed at a heating temperature of 450° C. for a time period in the range from 3 to 30 minutes (for a time period of 20 minutes according to the embodiment).

When the oxygen concentration is quickly decreased at a velocity in the range from around 6000 ppm/second to 20000 ppm/second, an insulation film whose specific dielectric constant ranges from for example 1.5 to 3.5 and that has a predetermined hardness can be formed.

Figure 13:
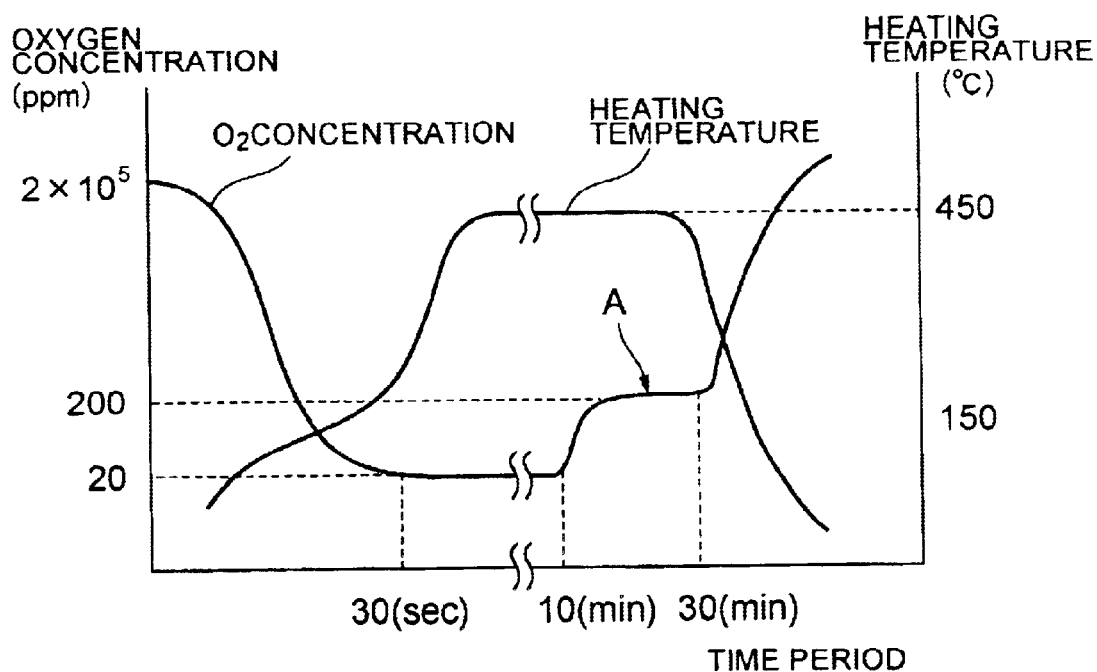
FIG. 13 is a graph showing the case of which oxygen concentration is increased during the heating process shown in FIG. 12.

FIG. 13 shows the case that the oxygen concentration is increased while the heating process is being performed as shown in FIG. 12. In this case, after the heating process had been started, when for example 10 minutes elapsed, oxygen is supplied to the heating process chamber 151 until the oxygen concentration becomes 200 ppm (denoted by letter A). In the state, the heating process is performed at a heating temperature of 450° C. for a time period in the range from 10 minutes to 20 minutes. While the heating process is being performed, the normal exhaust is performed. In addition, for example, 15 minutes later, the oxygen concentration is increased from 20 ppm to 200 ppm. In the state, the heating process is performed. As a result, only the front surface of the insulation film is oxidized. Thus, the front surface of the insulation film can be more hardened.

The oxygen concentration denoted by a letter A may be increased by the vacuum exhaust rather than the normal exhaust.

(Processing Condition 4)

Figures 14, 15:
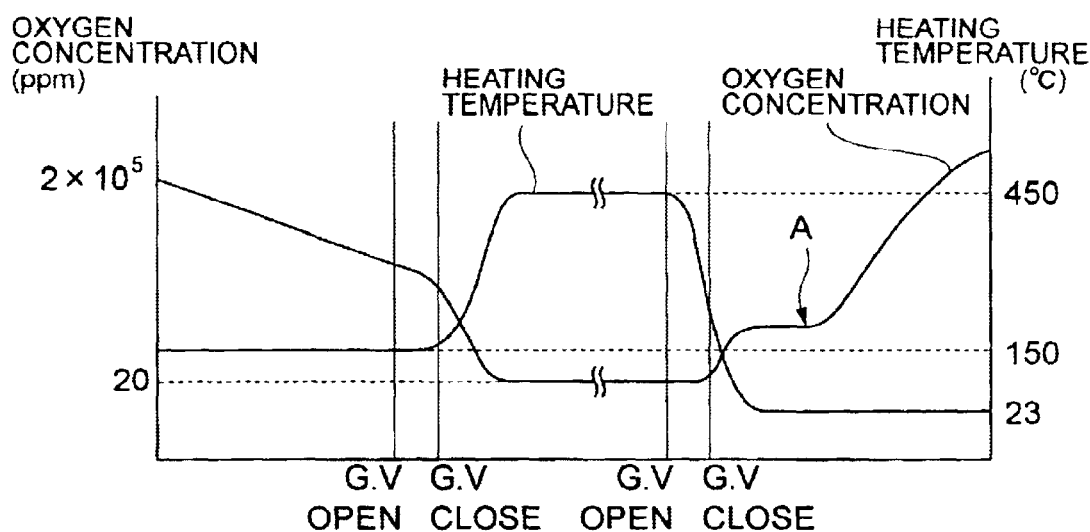
FIG. 14 is a table showing another processing condition.
FIG. 15 is a graph showing the relation between elapsed time and oxygen concentration in the processing condition shown in FIG. 14.

FIG. 14 shows processing condition 4 according to the embodiment of the present invention. FIG. 15 shows the relation between elapsed time and oxygen concentration in the processing condition 4. As with the processing condition 3, in the processing condition 4, in addition to the water cooling mechanism, with the heater built in the arm, a wafer W can be heated at a predetermined temperature in the range from 15° C. to 250° C. In the processing condition 4, a valve, a supply opening, an oxygen heater, and so forth (not shown) are disposed so that oxygen is supplied from the oxygen supply source 121 shown in FIG. 5 to the load lock chamber 152.

While the inner pressure of the load lock chamber 152 is being reduced from an atmospheric pressure to around 133 Pa, the wafer W is heated by the heater of the transferring arm 176 at a temperature of 150° C. for a predetermined time period. Thereafter, the gate valve 174 is opened and the wafer W is transferred to the heating process chamber 151. After the gate valve 174 is closed, the oxygen concentration is quickly decreased at a velocity in the range from around 6000 ppm/second to 20000 ppm/second until the inner pressure of the heating process chamber 151 becomes 20 ppm. At that point, the oxygen concentration of the load lock chamber 152 is gradually decreased to 20 ppm. The wafer W is heated by the heating plate 156 in the heating process chamber 151 at an inner pressure of around 133 Pa at a temperature of 45° C. for a predetermined time period. Thereafter, the gate valve 174 is opened. The wafer W is placed on the transferring arm 176 and transferred to the load lock chamber 152. Thereafter, the gate valve 174 is closed. In the load lock chamber 152, while the temperature of the wafer W is adjusted to 23° C., oxygen gas at a temperature in the range from for example 300° C. to 350° C. supplied from the oxygen supply source 121 is sprayed to the front surface of the wafer W for a time period in the range from 10 seconds to 20 seconds. Instead of oxygen gas, a mixture of oxygen gas and nitrogen gas may be sprayed on the front surface of the wafer W so that the oxygen concentration is controlled.

Thus, in the load lock chamber 152, the oxygen concentration is increased until 200 ppm (denoted by a letter A in FIG. 15). Thus, only the front surface of the insulation film is oxidized and the front surface of the insulation film can be more hardened.

In addition, after the temperature adjusting process and the surface oxidizing process are performed in the load lock chamber 152, when the wafer W is transferred from the load lock chamber 152 through the opening 181, the wafer W is directly exposed to the atmosphere. However, since the temperature of the wafer W has been lowered to 23° C. by the temperature adjusting process and the front surface of the insulation film has been oxidized, the wafer W is not further oxidized. Thus, an insulation film can be formed with high quality.

In the processing conditions 1 to 4, when the gate valve 174 is opened, since nitrogen gas is being successively supplied to the heating process chamber 151, the inner pressure of the heating process chamber 151 is higher than the inner pressure of the load lock chamber 152, particles can be prevented from entering from the load lock chamber 152 to the heating process chamber 151. Thereafter, the wafer W is unloaded from the heating process chamber 151 by the transferring arm 176. While the temperature of the unloaded wafer W is being adjusted at for example 23° C., the wafer W is transferred to the load lock chamber 152. In the load lock chamber 152, the wafer W is transferred to the second main transfer mechanism 23 through the support pins 158b.

According to the embodiment, when the SOD coating process is performed one time, an insulation film with a thickness of around 500 nm can be coated. Thus, when the SOD coating process is performed two times, an insulation film with a thickness of 1 μm can be coated.

As was described above, with one multi-functional hot plate curing unit (MHC), for example, a various types of low dielectric constant films, high dielectric constant films, or porous films can be formed. In addition, when the wafer W is temporarily placed in the load lock chamber 152 adjacent to the heating process chamber 151 without need to be transferred to another unit, the transferring time period for the wafer W can be shortened. In addition, footprints can be decreased.

Figure 16:
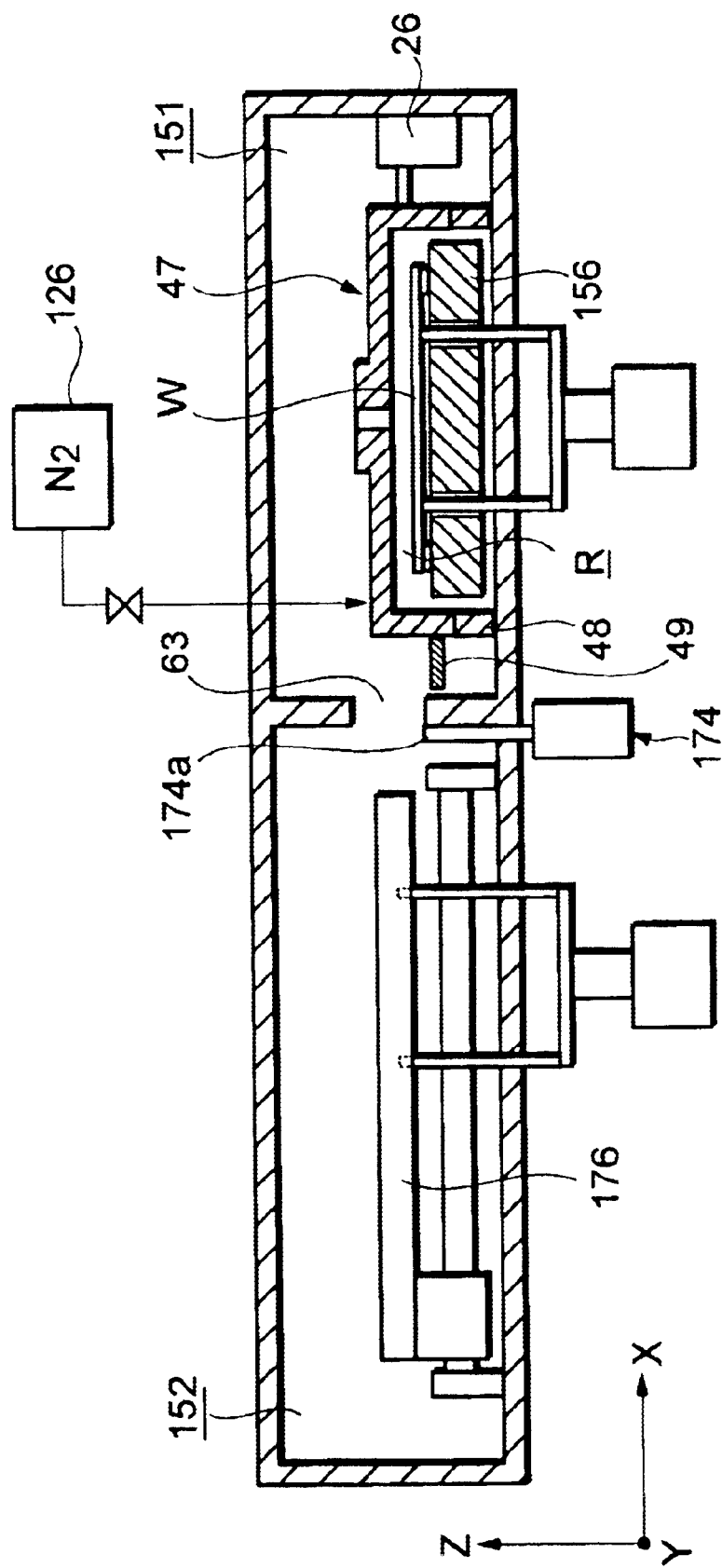
FIG. 16 is a sectional view showing a multi-functional hot plate curing unit (MHC) according to another embodiment.

FIG. 16 is a sectional view showing the structure of a multi-functional hot plate curing unit (MHC) according to another embodiment of the present invention. For simplicity, in FIG. 16, similar structural portions to those in FIG. 5 will be denoted by similar reference numerals and their description will be omitted. In addition, in FIG. 16, the gas supplying openings 122, 124, and 128, and the exhaust openings 123, 168, and 128 shown in FIG. 5 are omitted.

Figure 17:
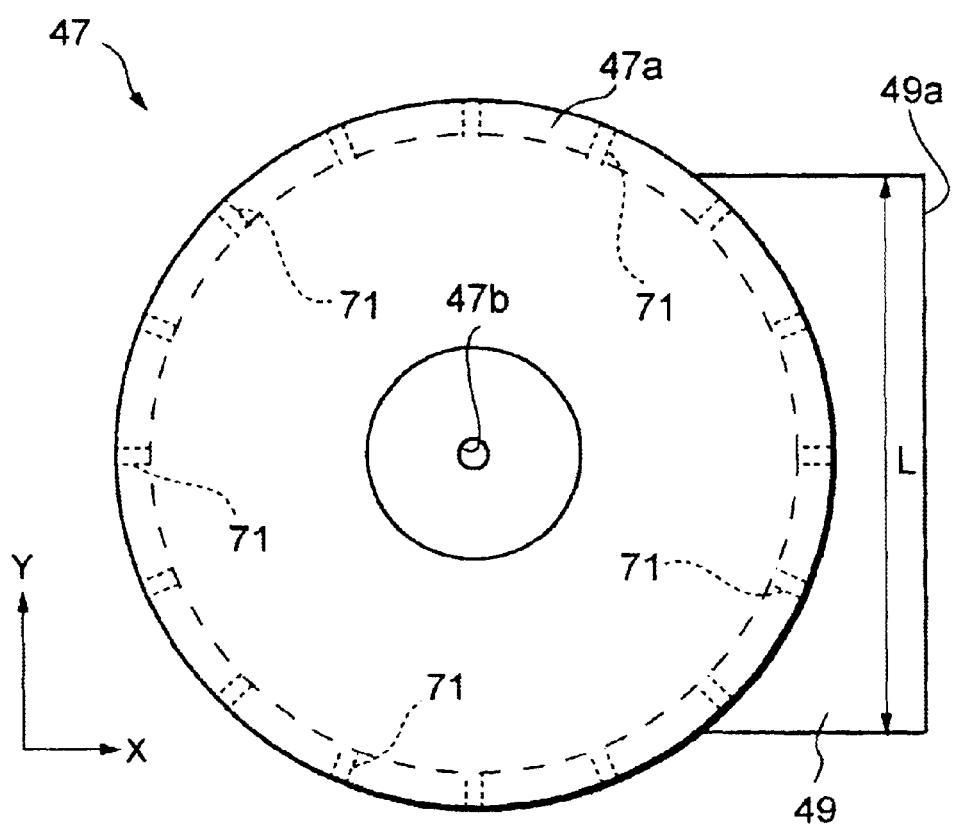
FIG. 17 is a plan view showing a lid member shown in FIG. 16.
Figure 18:
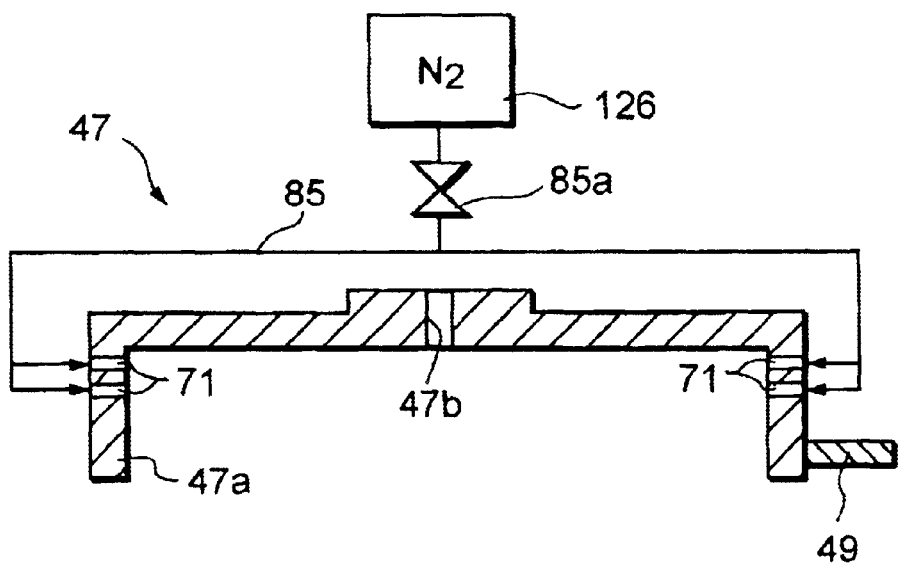
FIG. 18 is a sectional view showing the lid member shown in FIG. 17.

A lid member 47 is disposed at an upper portion of a heating plate 156. The lid member 47 can be raised and lowered by the operation of a driving motor 26. As the lid member 47 is raised and lowered, a flange portion 47a (see FIG. 17) of the lid member 47 contacts a cylindrical receiving member 48 disposed around a heating plate 156. As a result, a heating process space R in which a heating process is performed for a wafer W is formed. In addition, a canopy member 49 is disposed toward an opening 63 on a load lock chamber 152 side of the heating plate 156. As shown in FIG. 7, an edge portion 49a on the opening 63 side of the canopy member 49 is formed in a square shape. The length in the Y direction of the edge portion 49a is denoted by L. For example, the length L is larger than the diameter of the wafer W. The length L is almost equal to the width in the Y direction of the opening 63. In addition, as shown in FIGS. 17 and 18, a plurality of supply openings 71 for supplying inert gas for example nitrogen gas to the heating process space R are formed. Thus, nitrogen gas is supplied from a nitrogen gas supply source 126 to the chamber through a supply pipe 85 and a valve 85a. The nitrogen gas is exhausted through an exhaust opening 47b formed at a center portion of the lid member 47.

A shielding member (not shown) is disposed at a portion contacted to the receiving member 48 of the flange portion 47a. Thus, the air tightness of the heating process space R is improved. Alternatively, the shielding member may be disposed on the receiving member 48.

Next, the process and operation of the multi-functional hot plate curing unit (MHC) will be described.

Figure 19A:
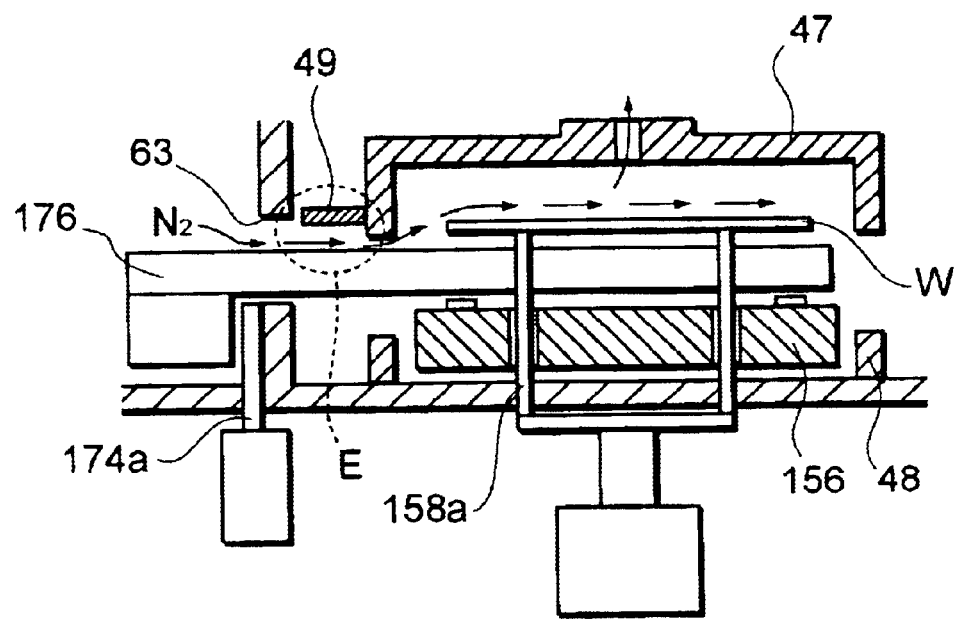
FIGS. 19A and 19B are sectional views showing a wafer heating process and a flow of nitrogen gas in the state that the lid member is raised.

After a wafer W has been transferred from the outside of the unit to the load lock chamber 152, the wafer W is placed on the transferring arm 176. As shown in FIG. 19A, the transferring arm 176 is entered into the heating process chamber 151 through the opening 63. The support pins 158a are raised and the wafer W is transferred thereto. At that point, the load lock chamber 152 has been filled with nitrogen gas. The nitrogen gas is supplied to the front surface of the wafer W placed at a lower portion of the lid member 47 as denoted by an arrow mark through a gas passage denoted by a broken line E and formed by the opening 63 and the canopy member 49 of the lid member 47 placed above the opening 63. Thus, the heating process chamber 151 is filled with the nitrogen gas. In particular, since the nitrogen gas is supplied to the space above the wafer W, it can be prevented from being oxidized. In addition, since the length in the Y direction of the canopy member 49 is L (see FIG. 17) that is almost the same as the width in the Y direction of the opening 63, the canopy member 49 has a function for regulating the flow of the nitrogen gas that flows from the load lock chamber 152. Thus, a flow of nitrogen gas to the heating process chamber 151 can be stably maintained.

Figure 19B:
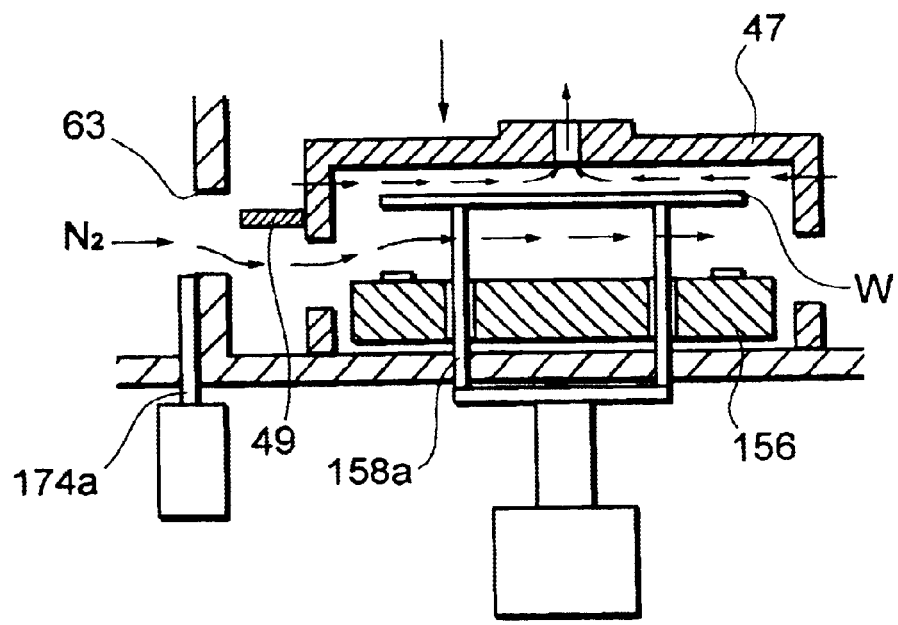

After the transferring arm 176 has been returned to the original position, as shown in FIG. 19B, the lid member 47 is lowered to a position just above the wafer W. The nitrogen gas is supplied from the nitrogen gas supply source 126 to the heating process space R. In the state shown in FIG. 19B, with radiated heat of the heating plate 156, the heating process is performed for the wafer W at a temperature of for example 150° C. for a time period of 20 seconds. At that point, the nitrogen gas is continuously being supplied from the load lock chamber 152. The nitrogen gas contributes to preventing the wafer W from being oxidized.

Figure 20:
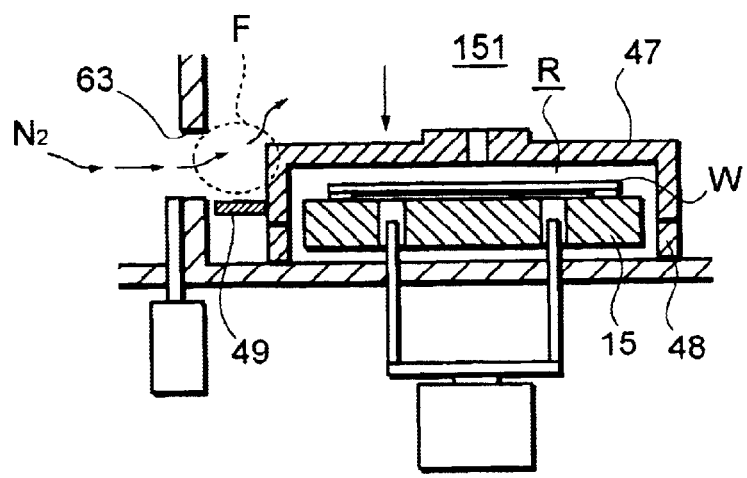
FIG. 20 is a sectional view showing a flow of nitrogen gas on a wafer in the state that the lid member is lowered.

Thereafter, as shown in FIG. 20, the lid member 47 is lowered and thereby the heating process space R is formed. As the lid member 47 is lowered, as shown in FIG. 20, the canopy member 49 is moved to a position below the opening 63. As a result, a passage F of the nitrogen gas denoted by a broken line is formed. Thus, the nitrogen gas is effectively supplied to the heating process chamber 151.

Figure 21:
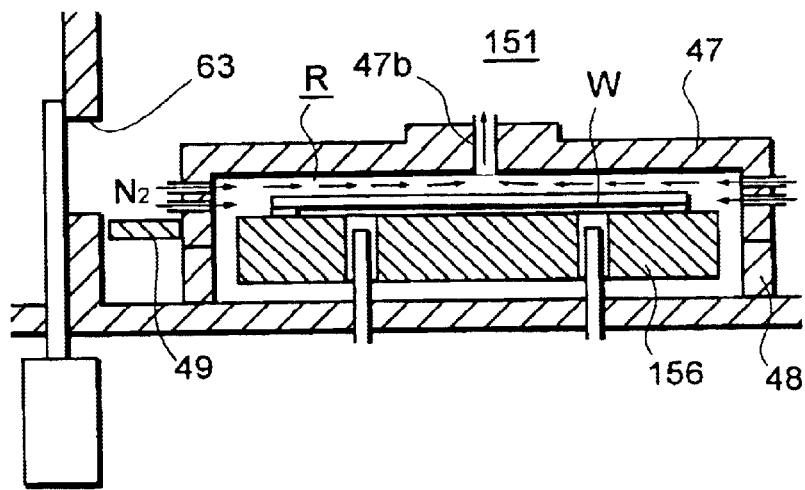
FIG. 21 is a sectional view showing a wafer heating process and a flow of nitrogen gas in a heating process space R in the state that the lid member is lowered.

As shown in FIG. 21, the nitrogen gas is supplied to the heating process space R so that the oxygen concentration therein becomes a predetermined low oxygen concentration. In addition, the heating process is performed for the wafer W at a temperature of for example 450° C. for a time period of for example 10 minutes. The nitrogen gas is exhausted from the exhaust opening 47b through the front surface of the wafer W. Since the heating process is performed in the heating process space R that is smaller than the heating process chamber 151, not only the wafer W can be prevented from being oxidized, but the amount of nitrogen gas can be decreased. In addition, since the atmosphere at the predetermined temperature is kept in the heating process space R, the power consumption can be suppressed.

Figure 22:
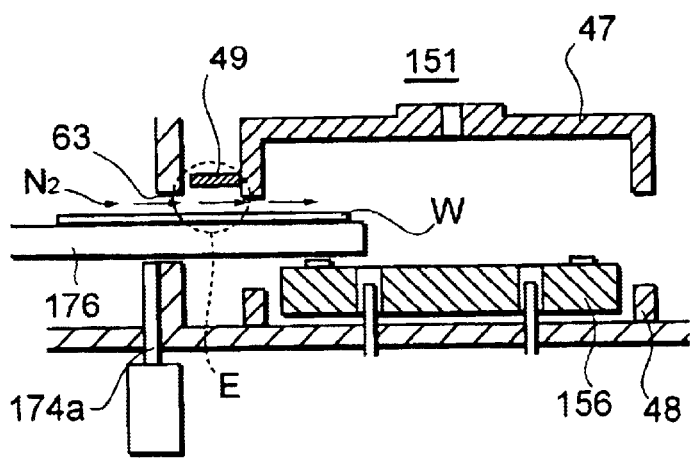
FIG. 22 is a sectional view showing an unloaded wafer and a flow of nitrogen gas after the heating process has been performed.

After the heating process has been completed for a predetermined time period at a predetermined temperature, as shown in FIG. 22, a gate shutter 174a is opened. The wafer W is transferred to the transferring arm 176 through the support pins 158a. While the temperature of the wafer W is being adjusted to for example 20° C., the wafer W is transferred to the load lock chamber 152. At that point, the nitrogen gas flows on the front surface of the wafer W from the load lock chamber 152 through a passage E. As a result, the nitrogen gas effectively prevents the wafer W from being oxidized. In addition, since the flow of the nitrogen gas is regulated through the passage E, the nitrogen gas passes through the front surface of the wafer W. Thus, the wafer W can be transferred while the nitrogen gas does not adversely affect a circuit pattern on the wafer W.

Figure 23:
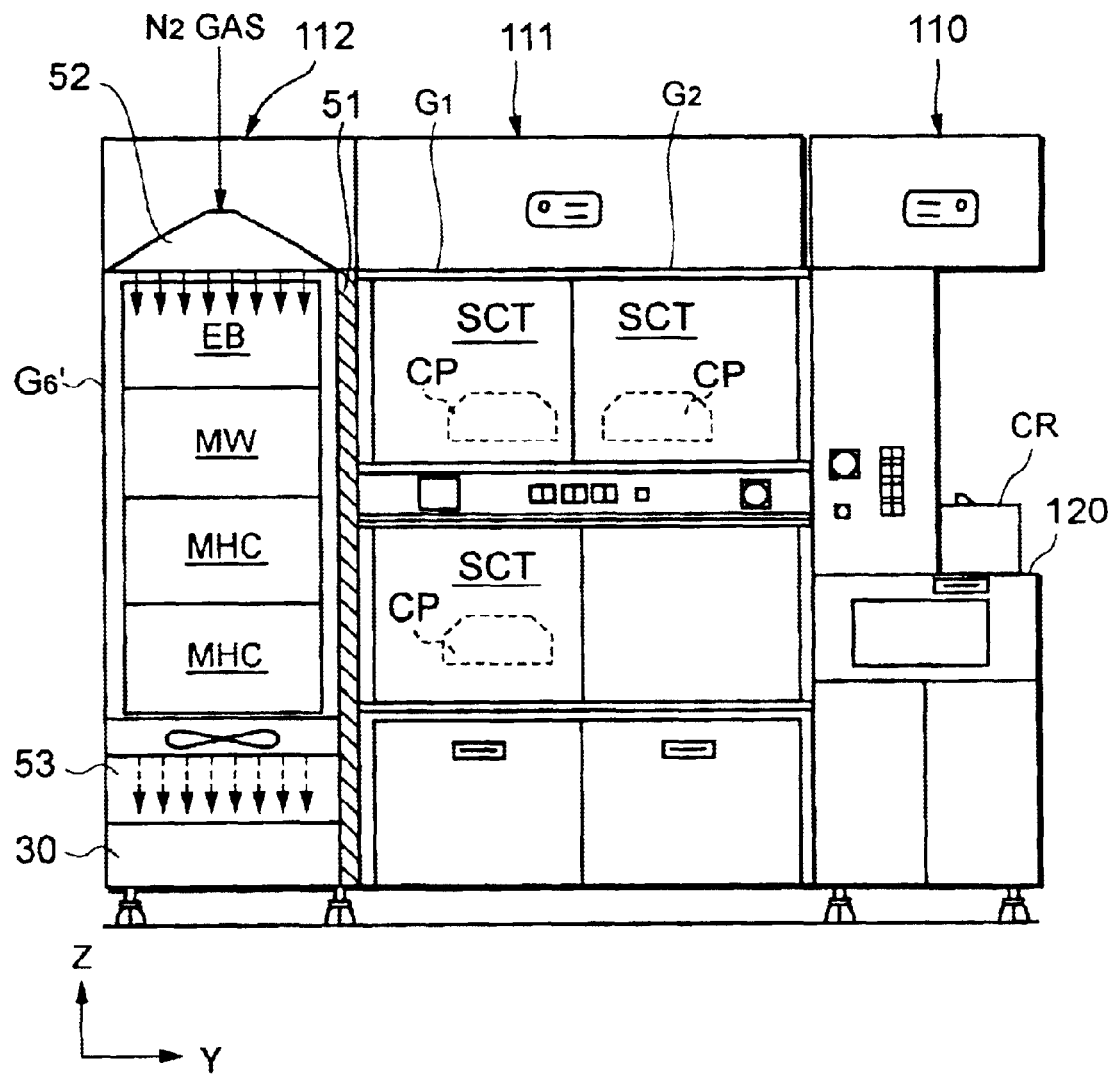
FIG. 23 is a front view showing an SOD system according to another embodiment of the present invention.
Figure 24:
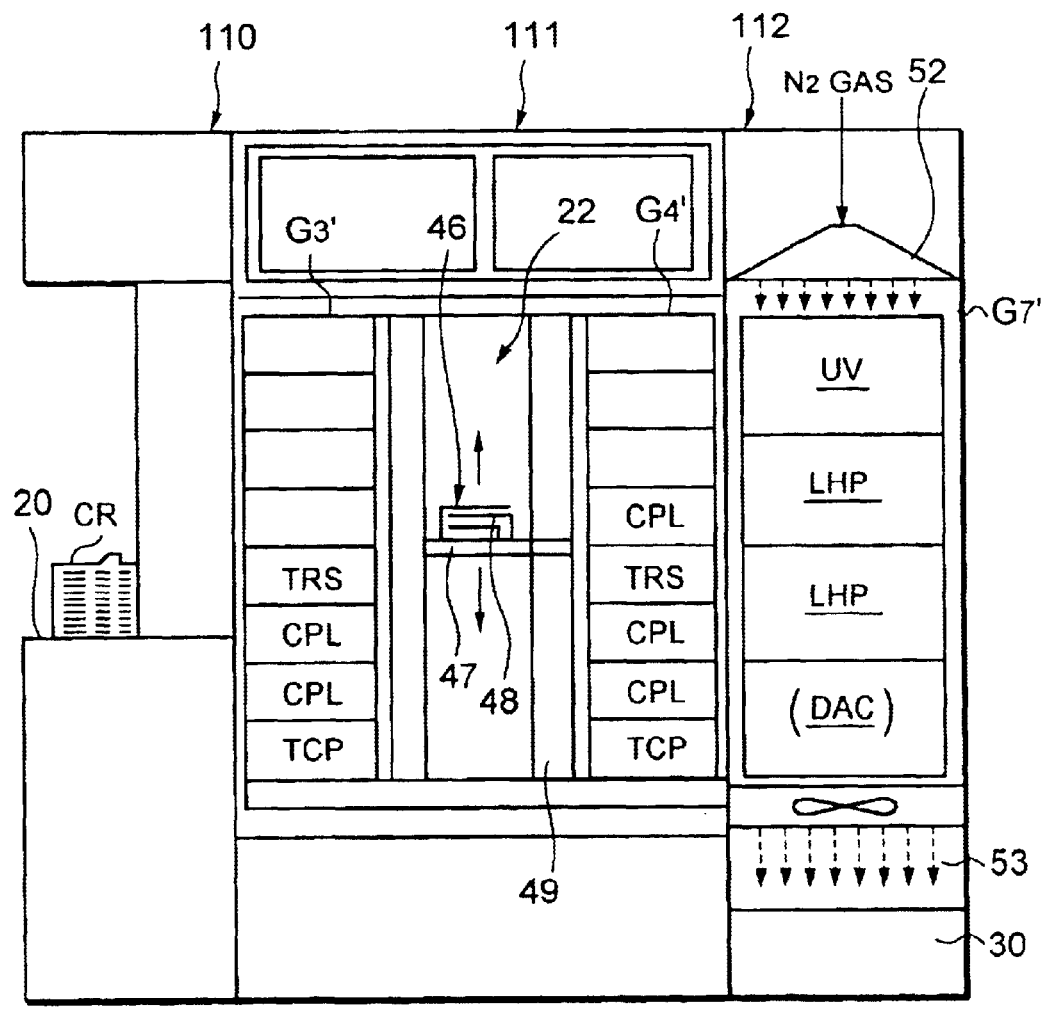
FIG. 24 is a rear view showing the SOD system shown in FIG. 23.

FIGS. 23 and 24 are a front view and a rear view showing an SOD system according to another embodiment of the present invention. For simplicity, in FIGS. 23 and 24, similar structural portions to those in FIGS. 2 and 3 will be denoted by similar reference numerals and their description will be omitted.

As shown in FIGS. 23 and 24, a third group G3' is composed of a transferring and cooling plate (TCP), two cooling process units (CPL), and a transition unit (TRS) arranged upward in succession as multi-staged processing units.

A fourth group G4' is composed of a transferring and cooling plate (TCP), three cooling process units (CPL), a transition unit (TRS), and a cooling process unit (CPL) arranged in succession as multi-staged processing units.

As shown in FIGS. 23 and 24, a sixth group G6' is composed of two multi-functional hot plate curing units (MHC), a micro wave process unit (MW), and an electron beam process unit (EB) arranged upward in succession as multi-staged processing units. A seventh group G7' is composed of an aging process unit (DAC), two low temperature heating process units (LHP), and an ultraviolet ray process unit (UV) arranged upward in succession as multi-staged processing units. Depending on a process, the aging process unit (DAC) may be disposed on the lowest stage. In FIGS. 23 and 24, reference numeral 30 represents a chemical chamber.

In a first processing block 111, the SOD coating process unit (SCT) is disposed. In a second processing block 112, heating process units are disposed. Thus, since the heating process units are gathered in the second processing block 112 and the coating process units are gathered in the first processing block 111 rather than the second processing block 112, the heating process units can be suppressed from thermally affecting the coating process units.

Between the first processing block 111 and the second processing block 112, a heat insulation wall 51 as a heat insulation member composed of for example a vacuum layer is disposed. As mentioned above, in addition to sectionalizing the heating process units and the coating process units, the heat insulation wall 51 is disposed therebetween. Thus, the heating process units can further suppressed from thermally affecting the coating process units.

In addition, at an upper portion of the second processing block 112, an inert gas supplying portion 52 is disposed. The inert gas supplying portion 52 supplies inert gas such as nitrogen gas to the second processing block 112 so as to control the atmosphere of the second processing block 112 with the inert gas. At a lower portion of the second processing block 112, an exhaust portion 53 is disposed. The exhaust portion 53 exhausts the second processing block 112. In such a manner, the atmosphere of the second processing block 112 is controlled with the inert gas. Thus, while a heating process is being performed for a wafer W and it is being transferred, it can be prevented from being oxidized. In particular, since the heating process units are gathered in the second processing block 112, the atmosphere can be effectively controlled.

Figure 25:
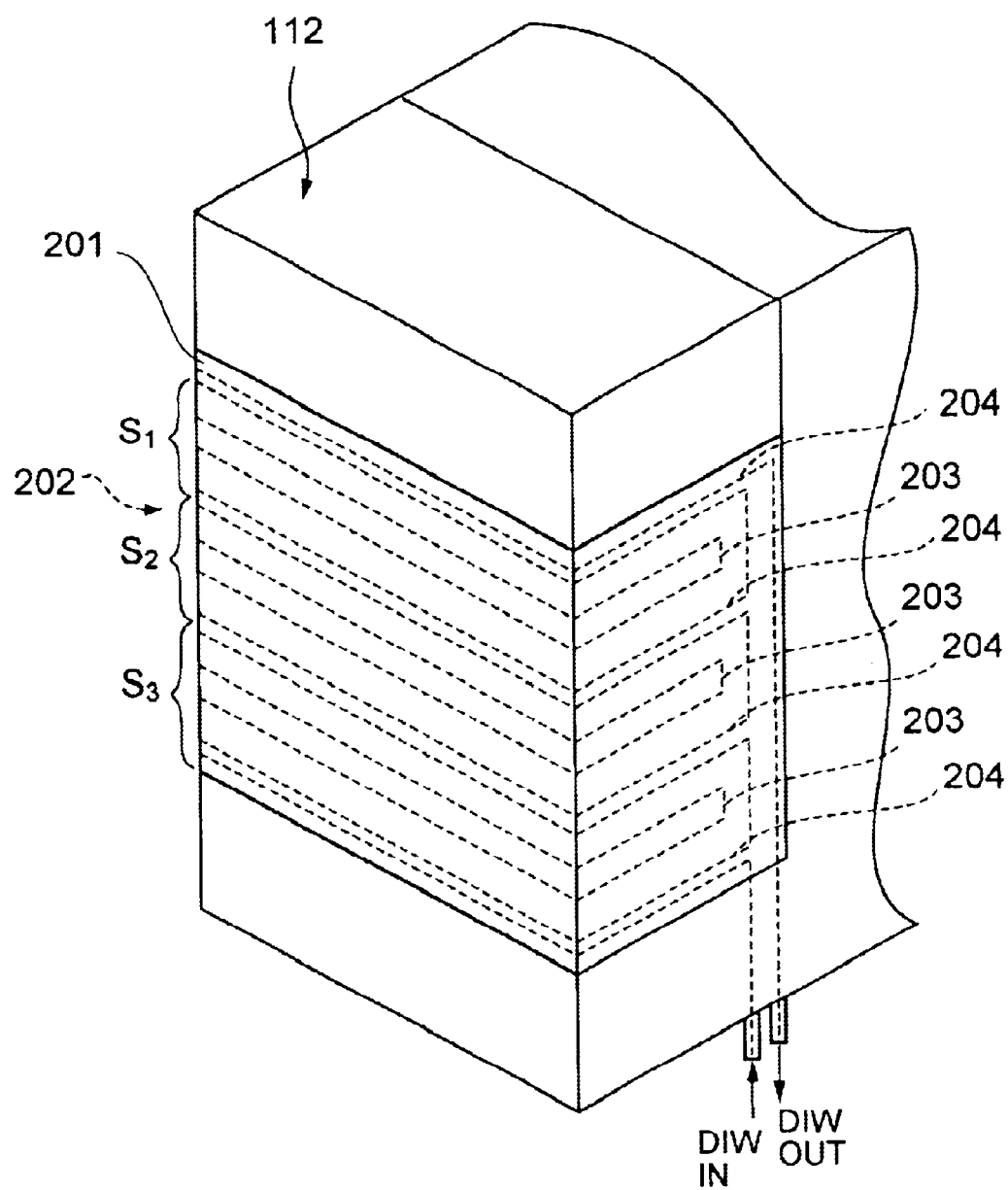
FIG. 25 is a perspective view showing a part of an SOD system according to a further embodiment of the present invention.

FIG. 25 shows another embodiment of the present invention. In the embodiment, a temperature adjusting portion 202 is disposed in a wall member 201 that surrounds a second processing block 112. The temperature adjusting portion 202 adjusts the inner temperature of the second processing block 112. In reality, the temperature adjusting portion 202 is composed of for example a heater 203 and a cooling pipe 204. The heater 203 is buried in the wall member 201. The power supplied to the heater 203 and the temperature and amount of cooling water supplied to the cooling pipe 204 are controlled by a controller (not shown). With the temperature adjusting portion 202, the inner temperature of the second processing block 112 can be more accurately controlled.

When the wall member 201 is vertically divided into three areas S1 to S3 and the temperatures thereof are independently controlled by the temperature adjusting portion 202, while the temperature of the second processing block 112 can be more accurately controlled, the air flow therein can also be controlled. For example, when the second processing block 112 is controlled in such a manner that the temperature of the upper area is higher than that of the lower area, an upward air flow deliberately takes place. The upward air flow allows sublimates that take place from a wafer W to be securely exhausted to the outside of the second processing block 112 without adversely affecting the wafer W. Thus in this case, it is preferred to deliver nitrogen gas from a lower portion and to exhaust gas to an upper portion.

It should be noted that the present invention is not limited to the above-described embodiments.

For example, according to the above-described embodiments, as a gas that contributes to decreasing the oxygen concentration in a heating process chamber, nitrogen gas was used. Alternatively, another inert gas such as argon gas, a reactive gas such as O2, NH3, H2, or O3, an organic compound such as NH4OH (NH3+H2O) or thinner, or a liquid vaporous substance such as HMDS may be used.

As a method for supplying such gas to the chamber, the gas may be supplied from an upper portion to a lower portion of the heating process chamber or from a lower portion to an upper portion thereof. Alternatively, after such gas is heated at a desired temperature, the gas may be supplied to a heating process chamber. In this case, as the temperature of the heating process chamber rises or lowers, the temperature of the gas may be dynamically varied. As a result, the inner temperature of the heating process chamber can be more accurately controlled.

According to the above-described embodiments, the SOD coating process (SCT), the aging process (DAC), and the solvent exchanging process (DSE) were performed two times each. Alternatively, these processes may be performed one time each.

In addition, according to the above-described embodiments, as a substrate, a silicon wafer was exemplified. Alternatively, the present invention can be applied to other substrates such as glass substrates.

As was described above, according to the present invention, the transferring time period for a wafer W can be shortened. In addition, footprints can be decreased. Moreover, processing conditions corresponding to various types of films can be provided. Thus, films can be formed and maintained in high quality. In addition, insulation films with desired dielectric constant and desired hardness can be formed.

The disclosure of Japanese Patent Applications No.2000-346620 filed Nov. 14, 2000 and No.2000-346602 filed Nov. 14, 2000, including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. An apparatus disposed adjacent to a main transfer mechanism for processing a substrate one by one, comprising:
    a heating process chamber in which a heating process is performed one by one for the substrate;
    a load lock chamber, integrally connected to the heating process chamber in a predetermined direction, having an opening closable with a shutter allowing the substrate to be transferred between the main transfer mechanism and the load lock chamber, and controlling at least oxygen concentration and pressure;
    a transferring arm, having a temperature adjusting portion adjusting a temperature of the substrate placed thereon, capable of moving between the heating process chamber and the load lock chamber, transferring the substrate one by one within the integrally connected zone of the heating process chamber and the load lock chamber, and allowing the main transfer mechanism to collect the substrate placed on the temperature adjusting portion of the transferring arm through the opening, and
    a gate valve shielding the integrally connected heating process chamber from the load lock chamber,
    wherein the heating process chamber comprises:
        a supplier supplying an inert gas to the heating process chamber;
        a pressure reducing portion reducing a pressure inside the heating chamber; and
        a controller controlling the supplier and the pressure reducing portion so that the oxygen concentration of the heating process chamber decreases at a velocity in the range from around 6000 ppm/second to 20000 ppm/second.

2. The apparatus, as set forth in claim 1,
    wherein the pressure reducing portion comprises a first exhausting portion vacuum exhausting the heating process chamber; and
    a second exhausting portion normally exhausting the heating process chamber;
    wherein the apparatus further comprising;
    a selecting portion selecting the first exhausting portion or the second exhausting portion and causing the selected portion to operate so that a pressure and an oxygen concentration inside the heating process chamber becomes the same as the pressure and the oxygen concentration inside the load lock chamber.

3. The apparatus, as set forth in claim 2,
    wherein the first exhausting portion reduces the inner pressure of the heating process chamber to around 1330 Pa or less, and
    wherein the second exhausting portion reduces the inner pressure of the heating process chamber to around 100000 Pa or less.

4. The apparatus, as set forth in claim 1, further comprising:
    a controller controlling the temperature of the heating process performed for the substrate in the heating process chamber.

5. The apparatus, as set forth in claim 4,
    wherein the controller is capable of controlling the temperature in the range from 100° C. to 800° C.

6. The substrate processing apparatus, as set forth in claim 1,
    wherein the transferring arm has a waiting portion in the load lock chamber for temporarily placing the substrate thereon when the heating process is performed one by one for the substrate in the heating process chamber in a changed processing condition.

7. The apparatus, as set forth in claim 1, further comprising:
    a supplier supplying an active gas to the load lock chamber; and
    a sprayer spraying the active gas to a front surface of the substrate in the load lock chamber so as to reform the front surface of the substrate.

8. The apparatus as set forth in claim 1, further comprising:

a supplier supplying an inert gas to the load lock chamber; and an exhausting portion vacuum exhausting the load lock chamber so that a pressure and an oxygen concentration inside the load lock chamber becomes the same as the pressure and the oxygen concentration inside the heating process chamber.

9. The substrate processing apparatus as set forth in claim 1, wherein the heating process chamber comprises an upper wall portion, a lower wall portion and a side wall portion; and wherein each of the upper wall portion, the lower wall portion and the side wall portion has a temperature controlling mechanism which independently controls a temperature in each of the wall portions.

10. The substrate processing apparatus as set forth in claim 9, wherein the temperature controlling mechanism comprises a heater and a cooling pipe.

11. The apparatus as set forth in claim 1, wherein the heating process chamber comprises a plurality of temperature controlling areas; and wherein each of the plurality of temperature controlling areas comprises a temperature controlling mechanism which independently controls a temperature in each of the temperature controlling areas.

12. The apparatus as set forth in claim 11, wherein the temperature controlling mechanism comprises a heater and a cooling pipe.

13. An apparatus disposed adjacent to a main transfer mechanism for processing a substrate one by one, comprising:

a heating process chamber in which a heating process is performed one by, one for the substrate;

a load lock chamber, integrally connected to the heating process chamber in a predetermined direction, having an opening closable with a shutter allowing the substrate to be transferred between the main transfer mechanism and the load lock chamber, and controlling at least oxygen concentration and pressure a transferring arm, having-a temperature adjusting portion adjusting a temperature of the substrate placed thereon, capable of moving between the heating process chamber and the load lock chamber, transferring the substrate one by one within the integrally connected zone of the heating process chamber and the load lock chamber, and allowing the main transfer mechanism to collect the substrate placed on the temperature adjusting portion of the transferring arm through the opening; and a gate valve shielding the integrally connected heating process chamber from the load lock chamber;

wherein the heating process chamber comprises:

a heating plate for heating the substrate; a lid body, capable of being lifted up and down, disposed above the heating plate to cover the heating plate when the lid body is lifted down;

a moving mechanism for raising and lowering the lid body; and a canopy member disposed opposite to the gate valve of the load lock chamber and provided integrally with the lid body so that the canopy member is placed in a upper portion of the gate valve when the lid body is lifted up, and placed in a lower portion of the gate valve when the lid body is lowered down.

14. The apparatus as set forth in claim 13, further comprising:

a first gas supplier supplying an inert gas to the load lock chamber.

15. The apparatus as set forth in claim 14, wherein the heating process chamber comprises a second gas supplier supplying the inert gas into a zone surrounded by the lid body and the heating plate.

* * * * *